US005620795A

United States Patent [19]
Haak et al.

[11] Patent Number: 5,620,795
[45] Date of Patent: Apr. 15, 1997

[54] ADHESIVES CONTAINING ELECTRICALLY CONDUCTIVE AGENTS

[75] Inventors: Christopher A. Haak, Oakdale; Michael A. Kropp, Cottage Grove, both of Minn.; Greggory S. Bennett, Ratinger, Germany

[73] Assignee: Minnesota Mining and Manufacturing Company, St. Paul, Minn.

[21] Appl. No.: 500,123

[22] Filed: Jul. 10, 1995

Related U.S. Application Data

[63] Continuation-in-part of Ser. No. 150,426, Nov. 10, 1993, and a continuation-in-part of Ser. No. 150,425, Nov. 10, 1993, and a continuation-in-part of Ser. No. 410,936, Mar. 27, 1995, Pat. No. 5,549,457, which is a continuation of Ser. No. 150,408, Nov. 10, 1993, abandoned, and a continuation of Ser. No. 343,247, Nov. 22, 1994.

[51] Int. Cl.⁶ ........................................................ B32B 7/12
[52] U.S. Cl. .......................... 428/344; 428/354; 428/356; 428/355 AC
[58] Field of Search .................................... 428/344, 354, 428/355, 356

[56] References Cited

U.S. PATENT DOCUMENTS

| | | | |
|---|---|---|---|
| Re. 24,906 | 12/1960 | Ulrich | 206/59 |
| 3,312,754 | 4/1967 | Marks et al. | 260/837 |
| 3,340,224 | 9/1967 | Sherman et al. | 260/41.5 |
| 3,406,087 | 10/1968 | Potter | 161/184 |
| 3,475,213 | 10/1969 | Stow | 117/227 |
| 3,491,070 | 1/1970 | Weaver | 260/80.73 |
| 3,514,326 | 5/1970 | Stow | 117/227 |
| 3,740,366 | 6/1973 | Sanderson et al. | 260/29.6 |
| 3,762,946 | 10/1973 | Stow et al. | 117/227 |
| 3,922,464 | 11/1975 | Silver et al. | 428/355 |
| 4,092,443 | 5/1978 | Green | 427/53 |
| 4,098,945 | 7/1978 | Oehmke | 428/327 |
| 4,113,981 | 9/1978 | Fujita et al. | 174/88 R |
| 4,127,699 | 11/1978 | Aumiller et al. | 428/461 |
| 4,181,752 | 1/1980 | Martens et al. | 427/54.1 |
| 4,199,646 | 4/1980 | Hori et al. | 428/344 |
| 4,223,067 | 9/1980 | Levens | 428/308 |
| 4,243,455 | 1/1981 | Shiba et al. | 156/187 |
| 4,243,500 | 1/1981 | Glennon | 204/159.12 |
| 4,247,656 | 1/1981 | Janssen | 521/174 |
| 4,252,593 | 2/1981 | Green | 156/231 |
| 4,303,485 | 12/1981 | Levens | 204/159.24 |
| 4,329,384 | 5/1982 | Vesley et al. | 428/40 |
| 4,330,590 | 5/1982 | Vesley | 428/336 |
| 4,335,171 | 6/1982 | Zenk | 428/40 |
| 4,364,972 | 12/1982 | Moon | 427/54.1 |
| 4,379,201 | 4/1983 | Heilmann et al. | 428/345 |
| 4,391,687 | 7/1983 | Vesley | 204/159.16 |
| 4,404,246 | 9/1983 | Charbonneau et al. | 428/212 |
| 4,415,615 | 11/1983 | Esmay et al. | 428/40 |
| 4,418,105 | 11/1983 | Stratton | 428/40 |
| 4,418,120 | 11/1983 | Kealy et al. | 428/343 |
| 4,421,822 | 12/1983 | Levens | 428/343 |
| 4,425,263 | 1/1984 | Nazarenko | 252/511 |
| 4,447,579 | 5/1984 | Takagi et al. | 525/113 |
| 4,503,200 | 3/1985 | Corley | 525/532 |
| 4,513,039 | 4/1985 | Esmay | 428/40 |
| 4,522,870 | 6/1985 | Esmay | 428/252 |
| 4,546,037 | 10/1985 | King | 428/323 |
| 4,548,862 | 10/1985 | Hartman | 428/323 |
| 4,552,604 | 11/1985 | Green | 156/246 |
| 4,557,960 | 12/1985 | Vernon et al. | 428/40 |
| 4,568,592 | 2/1986 | Kawaguchi et al. | 428/107 |
| 4,590,230 | 5/1986 | Kamada et al. | 524/77 |
| 4,599,265 | 7/1986 | Esmay | 428/355 |
| 4,606,962 | 8/1986 | Reylek et al. | 428/148 |
| 4,612,209 | 9/1986 | Forgo et al. | 427/54.1 |
| 4,612,242 | 9/1986 | Vesley et al. | 428/313.9 |
| 4,618,525 | 10/1986 | Chamberlain et al. | 428/209 |
| 4,619,867 | 10/1986 | Charbonneau et al. | 428/355 |
| 4,619,979 | 10/1986 | Kotnour et al. | 526/88 |
| 4,640,981 | 2/1987 | Dery et al. | 174/88 R |
| 4,645,711 | 2/1987 | Winslow et al. | 428/355 |

(List continued on next page.)

FOREIGN PATENT DOCUMENTS

| | | |
|---|---|---|
| 252717A2 | 1/1988 | European Pat. Off. . |
| 0303430A1 | 2/1989 | European Pat. Off. . |
| 0444354A2 | 9/1991 | European Pat. Off. . |
| 0511860A1 | 11/1992 | European Pat. Off. . |
| 0546746A1 | 6/1993 | European Pat. Off. . |
| 57-172906 | 10/1982 | Japan . |
| 10680 | 1/1988 | Japan . |
| 1-315409 | 6/1988 | Japan . |
| 2-202571 | 8/1990 | Japan . |
| 3-292379 | 12/1991 | Japan . |
| 4-103685 | 4/1992 | Japan . |
| 4-255779 | 9/1992 | Japan . |
| 5-310810 | 11/1993 | Japan . |
| 6-128544 | 5/1994 | Japan . |
| WO91/14461 | 10/1991 | WIPO . |
| WO92/02577 | 2/1992 | WIPO . |
| WO92/15651 | 9/1992 | WIPO . |
| WO93/13147 | 7/1993 | WIPO . |
| WO93/13148 | 7/1993 | WIPO . |
| WO94/29368 | 12/1994 | WIPO . |

OTHER PUBLICATIONS (Chem Abs: 118:60863y) Li, Shu Sheng, "Oil Absorptive Adhesives", *Zhanjie*, 1991, vol. 112, No. 6, pp. 19–22.

Fedors, Robert F., "A Method for Estimating Both the Solubility Parameters and Molar Volumes of Liquids", *Polymer Engineering and Science*, Feb., 1974, vol. 14, No. 2, pp. 147–154.

*Primary Examiner*—Joseph L. Schofer
*Assistant Examiner*—N. Sarofim
*Attorney, Agent, or Firm*—Gary L. Griswold; Walter N. Kirn; James V. Lilly

[57] ABSTRACT

Pressure sensitive adhesives and heat activatable adhesives that are the reaction product of an acrylic acid ester of a monohydric alcohol whose homopolymer has a $T_g$ less than 0° C.; a non-polar ethylenically unsaturated monomer whose homopolymer has a solubility parameter of no greater than 10.50 and a $T_g$ greater than 15° C.; 0–5 parts by weight of a polar ethylenically unsaturated monomer whose homopolymer has a solubility parameter of greater than 10.50 and a $T_g$ greater than 15° C.; and an electrically conductive agent.

4 Claims, 1 Drawing Sheet

U.S. PATENT DOCUMENTS

| | | | |
|---|---|---|---|
| 4,659,872 | 4/1987 | Dery et al. | 174/117 A |
| 4,666,771 | 5/1987 | Vesley et al. | 428/325 |
| 4,673,673 | 6/1987 | Laurent et al. | 514/178 |
| 4,673,750 | 6/1987 | Beers et al. | 549/215 |
| 4,680,226 | 7/1987 | Takeda | 428/327 |
| 4,693,935 | 9/1987 | Mazurek | 428/352 |
| 4,699,842 | 10/1987 | Jorgensen et al. | 428/343 |
| 4,701,279 | 10/1987 | Kawaguchi et al. | 252/511 |
| 4,710,536 | 12/1987 | Klingen et al. | 524/493 |
| 4,729,809 | 3/1988 | Dery et al. | 156/306.6 |
| 4,731,273 | 3/1988 | Bonk et al. | 428/57 |
| 4,731,282 | 3/1988 | Tsukagoshi et al. | 428/220 |
| 4,731,503 | 3/1988 | Kitanishi | 174/88 R |
| 4,737,559 | 4/1988 | Kellen et al. | 526/291 |
| 4,740,657 | 4/1988 | Tsukagoshi et al. | 174/88 R |
| 4,748,061 | 5/1988 | Vesley | 428/40 |
| 4,749,590 | 6/1988 | Klingen et al. | 427/54.1 |
| 4,751,269 | 6/1988 | Bonk et al. | 525/163 |
| 4,780,491 | 10/1988 | Velsey et al. | 523/219 |
| 4,814,040 | 3/1989 | Ozawa | 156/634 |
| 4,818,610 | 4/1989 | Zimmerman et al. | 428/345 |
| 4,880,683 | 11/1989 | Stow | 428/200 |
| 4,895,745 | 1/1990 | Vesley et al. | 428/40 |
| 4,950,537 | 8/1990 | Vesley et al. | 428/345 |
| 4,988,742 | 1/1991 | Moon et al. | 522/79 |
| 5,013,784 | 5/1991 | Yang | 524/458 |
| 5,024,880 | 6/1991 | Vesley et al. | 428/317.5 |
| 5,028,484 | 7/1991 | Martin et al. | 428/352 |
| 5,086,088 | 2/1992 | Kitano et al. | 522/170 |
| 5,087,494 | 2/1992 | Calhoun et al. | 428/40 |
| 5,102,924 | 4/1992 | Williams et al. | 522/4 |
| 5,106,902 | 4/1992 | Yang | 524/458 |
| 5,122,215 | 6/1992 | Shibata et al. | 156/250 |
| 5,130,375 | 7/1992 | Bernard et al. | 525/278 |
| 5,141,989 | 8/1992 | Jung et al. | 524/561 |
| 5,147,938 | 9/1992 | Kuller | 525/276 |
| 5,155,301 | 10/1992 | Mase | 174/88 R |
| 5,156,911 | 10/1992 | Stewart | 428/355 |
| 5,164,441 | 11/1992 | Yang | 524/458 |
| 5,262,232 | 11/1993 | Wilfong et al. | 428/327 |
| 5,275,856 | 1/1994 | Calhoun et al. | 428/40 |
| 5,278,199 | 1/1994 | Ohkawa et al. | 522/95 |
| 5,284,891 | 2/1994 | Wouters et al. | 524/522 |
| 5,308,887 | 5/1994 | Ko et al. | 522/148 |

ADHESIVES CONTAINING ELECTRICALLY CONDUCTIVE AGENTS

This application is a continuation-in-part of U.S. Ser. No. 08/150,426, filed Nov. 10, 1993; U.S. Ser. No. 08/150,425, filed Nov. 10, 1993; U.S. Ser. No. 08/410,936, filed Mar. 27, 1995 now U.S. Pat. No. 5,549,457, which is a continuation of U.S. Ser. No. 08/150,408, filed Nov. 10, 1993, now abandoned; and U.S. Ser. No. 08/343,247, filed Nov. 22, 1994, the contents of which are hereby incorporated by reference. This application is related to U.S. Ser. No. 08/150,417, filed Nov. 10, 1993, which is assigned to the same assignee as the present application and is hereby incorporated by reference.

BACKGROUND OF THE INVENTION

1. Field of the Invention

This invention relates to adhesives containing electrically conductive agents.

2. Description of the Background Art

Acrylate pressure sensitive adhesives are well known in the art. Many of these adhesives are copolymers of an alkyl ester of acrylic acid and a minor portion of a polar co-monomer. Due to the presence of the polar co-monomer these adhesives generally do not adhere well to low energy and oily surfaces (e.g., surfaces having a critical surface tension of wetting of no greater than about 35 dynes/cm). Although adhesion can be improved through addition of a tackifier, the degree of improvement is limited because most commercially available tackifiers are not miscible in the polar monomer-containing adhesive.

Acrylate heat activatable adhesives and the use of electrically conductive agents in adhesives are also known. However, the present invention provides superior adhesives containing electrically conductive agents.

SUMMARY OF THE INVENTION

In one aspect, the invention features a pressure sensitive adhesive that includes the reaction product of starting materials comprising:

(a) 25–97 parts by weight of an acrylic acid ester of a monohydric alcohol whose homopolymer has a $T_g$ less than 0° C.;

(b) 3–75 parts by weight of a non-polar ethylenically unsaturated monomer whose homopolymer has a solubility parameter of no greater than 10.50 and a $T_g$ greater than 15° C.;

(c) 0–5 parts by weight of a polar ethylenically unsaturated monomer whose homopolymer has a solubility parameter of greater than 10.50 and a $T_g$ greater than 15° C.; and (d) an effective amount of an electrically conductive agent selected from nickel, silver, copper, or gold particles. The relative amounts of the acrylic acid ester, the non-polar ethylenically unsaturated monomer, and the polar ethylenically unsaturated monomer are chosen such that the 90° peel adhesion of the pressure sensitive adhesive to a polypropylene surface is at least 2 lbs/0.5 in. after a 72 hour dwell at room temperature as measured according to Test Procedure B-I, infra.

In another aspect, the invention provides a heat activatable adhesive comprising the reaction product of starting materials comprising:

(a) 25–97 parts by weight of an acrylic acid ester of a monohydric alcohol whose homopolymer has a $T_g$ less than 0° C.;

(b) 3–75 parts by weight of a non-polar ethylenically unsaturated monomer whose homopolymer has a solubility parameter of no greater than 10.50 and a $T_g$ greater than 15° C.;

(c) 0–5 parts by weight of a polar ethylenically unsaturated monomer whose homopolymer has a solubility parameter of greater than 10.50 and a $T_g$ greater than 15° C.; and (d) an effective amount of an electrically conductive agent; wherein said adhesive is essentially nontacky at 20 C and has a $T_g$ of 30 C or greater. In other embodiments, the adhesive has a $T_g$ of 35 C or greater; 40 C or greater; and 50 C or greater.

In another aspect, the invention features a pressure sensitive adhesive that includes the polymerization product of:

(a) 25–97 parts by weight of an acrylic acid ester of a monohydric alcohol whose homopolymer has a $T_g$ less than 0° C.;

(b) 3–75 parts by weight of a non-polar ethylenically unsaturated monomer whose homopolymer has a solubility parameter of no greater than 10.50 and a $T_g$ greater than 15° C.; and (c) 0–5 parts by weight of a polar ethylenically unsaturated monomer whose homopolymer has a solubility parameter of greater than 10.50 and a $T_g$ greater than 15° C. The relative amounts of the acrylic acid ester, the non-polar ethylenically unsaturated monomer, and the polar ethylenically unsaturated monomer are chosen such that the 90° peel adhesion of the pressure sensitive adhesive to a surface provided with 1.5±0.25 mg/in$^2$ oil is greater than zero after a 10 second dwell at room temperature as measured according to Test Procedure B-II, infra.

In another aspect, the invention features a pressure sensitive adhesive that includes:

(a) the polymerization product of:

(i) 25–98 parts by weight of an acrylic acid ester of a monohydric alcohol whose homopolymer has a $T_g$ less than 0° C.;

(ii) 2–75 parts by weight of a non-polar ethylenically unsaturated monomer whose homopolymer has a solubility parameter of no greater than 10.50 and a $T_g$ greater than 15° C.;

(iii) 0–5 parts by weight of a polar ethylenically unsaturated monomer whose homopolymer has a solubility parameter of greater than 10.50 and a $T_g$ greater than 15° C.; and (b) at least one tackifier that is miscible in the polymerization product at room temperature.

By "miscible" it is meant that the final pressure sensitive adhesive does not exhibit macroscopic phase separation as evidenced by optical clarity at room temperature.

In one preferred embodiment, the relative amounts of the acrylic acid ester, non-polar ethylenically unsaturated monomer, and polar ethylenically unsaturated monomer are chosen such that the 90° peel adhesion of the pressure sensitive adhesive to a polypropylene surface is at least 2 lbs/0.5 in. after a 72 hour dwell at room temperature as measured according to Test Procedure B1-III, infra.

In another preferred embodiment, the relative amounts of the acrylic acid ester, non-polar ethylenically unsaturated monomer, and polar ethylenically unsaturated monomer are chosen such that the 90° peel adhesion of the pressure sensitive adhesive to a surface provided with 1.5±0.25 mg/in$^2$ of oil is greater than zero after a 10 second dwell at room temperature as measured according to Test Procedure B2-III, infra.

The solubility parameter referred to herein is calculated according to the technique described in Fedors, Polym. Eng. and Sci., 14:147 (1974). A monomer whose homopolymer has a solubility parameter of greater than 10.50 when measured according to the Fedors technique is referred to herein as a polar monomer, whereas a monomer whose homopolymer has a solubility parameter of 10.50 or less when measured according to the Fedors technique is referred to herein as a non-polar monomer.

The invention provides pressure sensitive adhesives and tackified pressure sensitive adhesives which, by virtue of incorporating a non-polar ethylenically unsaturated monomer and limiting the polar monomer content to no more than 5 parts, exhibit good adhesion to low energy (e.g., plastics such as polyolefin plastics) surfaces and oily surfaces. The adhesives exhibit good adhesion to high energy surfaces such as stainless steel as well. Because the non-polar monomer reduces the polarity of the adhesive, commercially available tackifiers (many of which have low polarity themselves) are miscible in the adhesives and thus may be used. Thus, rather than tailoring the tackifier to make it miscible with the acrylate polymer, the invention tailors the properties of the acrylate polymer to make it miscible with the tackifier.

The adhesives are less toxic than, e.g., adhesives containing polar heteroatom acrylates. The adhesives further exhibit good shear properties both at low and high temperatures, particularly when a small amount (no more than 5 parts) of a polar co-monomer is included.

The adhesives offer the further advantage of reduced sensitivity to moisture and reduced tendency to corrode metals such as copper relative to pressure sensitive adhesives containing higher amounts of polar co-monomers. Furthermore, the adhesives interact to a lesser extent with polar additives and, in some cases, increase the solubility of non-polar additives compared to pressure sensitive adhesives containing higher amounts of polar co-monomers.

Other features and advantages of the invention will be apparent from the following description of the preferred embodiments thereof, and from the claims.

DESCRIPTION OF THE PREFERRED EMBODIMENTS

Figure 1:
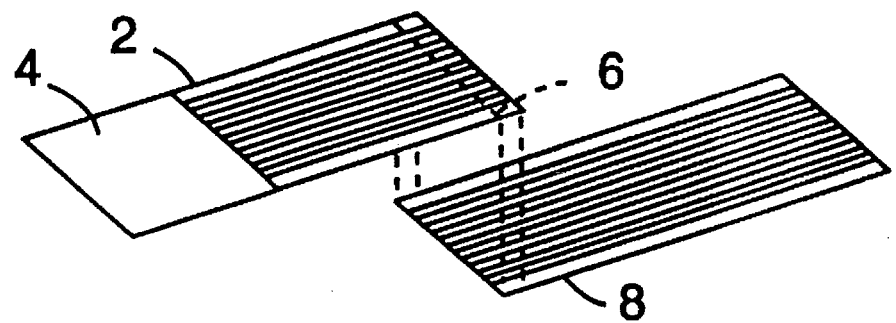
FIG. 1 is an apparatus for measuring the interconnect resistance of an adhesive bond.

One class of pressure sensitive adhesives according to this invention displays good adhesion to both low energy surfaces such as polypropylene and high energy surfaces such as stainless steel. In both cases, the 90° peel strength after a 72 hour dwell is at least 2 lbs/0.5 in., preferably at least 2.5 lbs/0.5 in., and more preferably at least 3 lbs/0.5 in. measured according to Test Procedure B-I, infra. The adhesives also display good cohesive strength properties as measured by the shear strength. Preferably, the shear strength at both room temperature and 70° C. is greater than 50 minutes, more preferably greater than 1,000 minutes, and even more preferably greater than 10,000 minutes measured according to Test Procedure C-I, infra.

A second class of pressure sensitive adhesives according to this invention displays good adhesion to oily surfaces (e.g., oily metal surfaces). Examples of oily surfaces include surfaces provided with mineral oil, emulsion oils, peanut oil, motor oil (e.g., 5W-30), WD40, and Ferricote 61 A US (Quaker Chemical Co.) (a common protectant for cold rolled steel). The 90° peel adhesion to a surface provided with 1.5±0.25 mg/in$^2$ oil after a 10 second dwell at room temperature is greater than zero, preferably at least 2 oz./0.5 in., and more preferably at least 4 oz/0.5 in. measured according to Test Procedure B-II, infra. After a 1 minute dwell, the adhesion preferably builds to at least 5 oz/0.5 in. and more preferably to at least 10 oz/0.5 in. measured according to Test Procedure B-II, infra. The adhesives also display good cohesive strength properties as measured by the shear strength. Preferably, the shear strength at both room temperature and 70° C. is greater than 50 minutes, more preferably greater than 300 minutes, and even more preferably greater than 600 minutes.

The tackified pressure sensitive adhesives of this invention display good adhesion to both low energy surfaces such as polypropylene, high energy surfaces such as stainless steel, and oily surfaces (e.g., oily metal). Examples of oily surfaces include surfaces provided with mineral oil, emulsion oils, peanut oil, motor oil (e.g., 5W-30), WD40, and Ferricote 61 A US (Quaker Chemical Co.) (a common protectant for cold rolled steel).

The 90° peel adhesion to polypropylene or to steel after a 72 hour dwell at room temperature is at least 2 lbs/0.5 in., preferably at least 3 lbs/0.5 in., and more preferably at least 4 lbs/0.5 in. measured according to Test Procedure B1-III, infra. The 90° peel adhesion to a surface provided with 1.5±0.25 mg/in$^2$ of oil after a 10 second dwell at room temperature is greater than zero, preferably at least 2 oz/0.5 in., and more preferably at least 4 oz./0.5 in. measured according to Test Procedure B2-III, infra. After a 1 minute dwell, the adhesion preferably builds to at least 5 oz/0.5 in. and more preferably to at least 10 oz/0.5 in. measured according to Test Procedure B2-III, infra.

The tackified adhesives also display good cohesive strength properties as measured by the shear strength. Preferably, the shear strength at both room temperature and 70° C. is greater than 50 minutes, more preferably greater than 1,000 minutes, and even more preferably greater than 10,000 minutes measured according to Test Procedures C1-III and C2-III, infra.

The properties of the pressure sensitive adhesives and tackified pressure sensitive adhesives according to the invention are achieved by controlling the monomeric composition to achieve the appropriate polarity (as measured by the solubility parameter of the homopolymers of the individual monomers determined according to the Fedors technique) and rheological properties ($T_g$ as measured by the 1 radian/second tan delta maximum temperature of the adhesive polymer).

The ability to incorporate a tackifier increases the value of the peel strength beyond what it would be in the absence of the tackifier. The tackifier also increases "formulation freedom," i.e., the ability to adjust the properties of the adhesives for particular applications by introducing another variable, namely, the tackifier.

A list of several common monomers and their respective Fedors' solubility parameters is shown in Table 1. Table 1 is subdivided into four sections: low Tg acrylate monomers, high Tg acrylate monomers, high Tg methacrylate monomers, and vinyl monomers.

TABLE 1

FEDORS' SOLUBILITY PARAMETERS

| Repeat Unit | Solubility Parameter $(cal/cm^3)^{0.5}$ |
|---|---|
| Octadecyl acrylate (ODA) | 8.99 |
| Lauryl acrylate (LA) | 9.15 |
| Iso-octyl acrylate (IOA) | 9.22 |
| 2-ethylhexyl acrylate (2-EHA) | 9.22 |
| Butyl acrylate (BA) | 9.77 |
| Propyl acrylate (PA) | 9.95 |
| Ethyl acrylate EA) | 10.20 |
| 3,3,5 trimethylcyclohexyl acrylate (TMCA) | 9.35 |
| Iso-bornyl acrylate (IBA) | 9.71 |
| Cyclohexyl acrylate (CHA) | 10.16 |
| N-octyl acrylamide (NOA) | 10.33 |
| Tetrahydrofurfuryl acrylate (THFA) | 10.53 |
| Methyl acrylate (MA) | 10.56 |
| Glycidyl acrylate (GA) | 11.32 |
| 2-Phenoxyethylacrylate (2-PhEA) | 11.79 |
| N-vinylcaprolactam (NVC) | 12.10 |
| N,N,-Dimethylacrylamide (DMA) | 12.32 |
| N-vinyl-2-pyrrolidone (NVP) | 13.38 |
| Acrylic Acid (AA) | 14.04 |
| Methylmethacrylate (MMA) | 9.93 |
| Ethylmethacrylate (EMA) | 9.72 |
| Propylmethacrylate (PMA) | 9.57 |
| Vinyl Acetate | 10.56 |
| Styrene | 11.87 |

The rheological character of the adhesive polymer can be partially but usefully described by the $T_g$ as measured by the 1 radian/second tan delta maximum temperature. In the case of adhesives designed for adhesion to low energy surfaces, it is preferable for the $T_g$ as measured by the 1 radian/second tan delta maximum of the polymer to have a value between −45° C. and 15° C., more preferably between −25° C. and 0° C., and even more preferably between −20° C. and −5° C. In the case of adhesives designed for adhesion to oily surfaces, it is preferable for the $T_g$ as measured by the 1 radian/second tan delta maximum temperature of the polymer to have a value between −45° C. and 15° C., more preferably between −35° C. and 0° C., and even more preferably between −30° C. and −5° C.

In both cases, the adhesives according to the invention having the requisite polarity and rheological properties contain 25–97 parts (more preferably 40–85 parts) of an acrylic acid ester whose homopolymer has a $T_g$ less than 0° C. (more preferably less than −20° C.), 3–75 parts (more preferably 15–60 parts) of a non-polar ethylenically unsaturated monomer whose homopolymer has a $T_g$ greater than 15° C., and 0–5 parts (more preferably 0–3 parts) of a polar ethylenically unsaturated monomer whose homopolymer has a $T_g$ greater than 15° C.

In the case of tackified pressure sensitive adhesives, it is preferable for the 1 radian/second tan delta maximum temperature of the polymer to have a value between −45° C. and 15° C., more preferably between −25° C. and 5° C., and even more preferably between −20° C. and 0° C. The tackified adhesives according to the invention having the requisite polarity and rheological properties contain 25–98 parts (more preferably 70–97 parts) of an acrylic acid ester whose homopolymer has a $T_g$ less than 0° C. (more preferably less than −20° C.), 2–75 parts (more preferably 3–30 parts) of a non-polar ethylenically unsaturated monomer whose homopolymer has a $T_g$ greater than 15° C., 0–5 parts (more preferably 0–3 parts) of a polar ethylenically unsaturated monomer whose homopolymer has a $T_g$ greater than 15° C., and one or more tackifiers.

In all cases, the acrylic acid ester is a monofunctional acrylic ester of a monohydric alcohol having from about 4 to about 18 carbon atoms in the alcohol moiety whose homopolymer has a $T_g$ less than 0° C. Included in this class of acrylic acid esters are isooctyl acrylate, 2-ethylhexyl acrylate, isononyl acrylate, isodecyl acrylate, decyl acrylate, lauryl acrylate, hexyl acrylate, butyl acrylate, and octadecyl acrylate, or combinations thereof. In the case of octadecyl acrylate, the amount is chosen such that side chain crystallization does not occur at room temperature.

The non-polar ethylenically-unsaturated monomer is a monomer whose homopolymer has a solubility parameter as measured by the Fedors method of not greater than 10.50 and a $T_g$ greater than 15° C. In a preferred embodiment, the non-polar ethylenically-unsaturated monomer is a monomer whose homopolymer has a solubility parameter as measured by the Fedors method of not greater than 10.3, more preferably not greater than 9.9. The non-polar nature of this monomer improves the low energy surface adhesion and oily surface adhesion of the adhesive. It also improves the structural properties of the adhesive (e.g., cohesive strength) relative to a homopolymer of the acrylic acid ester described above. Examples of suitable non-polar monomers include 3,3,5 trimethylcyclohexyl acrylate, cyclohexyl acrylate, isobornyl acrylate, N-octyl acrylamide, t-butyl acrylate, methyl methacrylate, ethyl methacrylate, and propyl methacrylate or combinations thereof.

The adhesive may contain a limited quantity (e.g., no more than 5 parts) of a polar ethylenically unsaturated monomer whose homopolymer has a solubility parameter as measured by the Fedors method of greater than 10.50 and a $T_g$ greater than 15° C. to improve structural properties (e.g., cohesive strength). It is not desirable to include more than 5 parts of the polar monomer because the polar monomer impairs low energy surface adhesion and oily surface adhesion, and reduces tackifier miscibility. Examples of suitable polar monomers include acrylic acid, itaconic acid, certain substituted acrylamides such as N,N dimethylacrylamide, N-vinyl-2-pyrrolidone, N-vinyl caprolactam, acrylonitrile, tetrahydrofurfuryl acrylate, glycidyl acrylate, 2-phenoxyethylacrylate, and benzylacrylate, or combinations thereof.

In the case of tackified compositions, the tackifier must be miscible with the acrylate-containing polymer of the adhesive such that macroscopic phase separation does not occur in order to improve the properties of the adhesive. Preferably, the adhesive is free of microscopic phase separation as well. Most commercially available tackifiers are hydrocarbon-based and thus of low polarity. Such tackifiers ordinarily are not miscible with conventional, polar monomer-containing adhesives. However, by incorporating a non-polar monomer into the adhesive (thereby increasing the non-polar character of the adhesive) the invention allows a variety of commercially available tackifiers to be used. The total amount of tackifier is preferably 5–60 parts per 100 parts acrylate-containing polymer, and more preferably about 15–30 parts. The particular amount of tackifier depends on the composition of the acrylate-containing polymer and is generally selected to maximum peel properties without compromising desired shear strength.

Because the adhesives are preferably prepared by polymerizing the monomers in the presence of the tackifier according to a free radical process, it is further desirable to select a tackifier that does not substantially impede the polymerization process, e.g., by acting as a free radical scavenger, chain termination agent, or chain transfer agent. A measure of the ability of the tackifier to inhibit free radical polymerization in a bulk polymerization process for a given process condition is defined here as the "inhibition factor." The inhibition factor (IF) is determined from the monomer conversion test and is the ratio of (1) the percent volatiles of the tackified sample ($C_t$) less the percent volatiles of an identically formulated and processed sample without tackifier ($C_o$) and (2) the percent volatiles of an identically formulated and processed sample without tackifier ($C_o$). The inhibition factor equation is shown below:

$$IF = \frac{(C_t - C_o)}{C_o}$$

Although a wide variety of tackifiers may be used, in cases where free radical polymerization is involved the class of tackifiers known under the tradename Regalrez resins commercially available from Hercules are preferred. These tackifiers are produced by polymerization and hydrogenation of pure monomer hydrocarbon feed stock. Suitable resins include Regalrez resins 1085, 1094, 6108, and 3102.

The monomer mixture can be polymerized by various techniques, with photoinitiated bulk polymerization being preferred. An initiator is preferably added to aid in polymerization of the monomers. The type of initiator used depends on the polymerization process. Photoinitiators which are useful for polymerizing the acrylate monomers include benzoin ethers such as benzoin methyl ether or benzoin isopropyl ether, substituted benzoin ethers such as 2-methyl-2-hydroxylpropiophenone, aromatic sulfonyl chlorides such as 2-naphthalenesulfonyl chloride, and photoactive oxides such as 1-phenyl-1,2-propanedione-2-(o-ethoxycarbonyl)oxime. An example of a commercially available photoinitiator is Irgacure™ 651 available from Ciba-Geigy Corporation, having the formula 2,2-dimethoxy-1,2-diphenylethane-1-one). Generally, the photoinitiator is present in an amount of about 0.005 to 1 weight percent based on the weight of the monomers. Examples of suitable thermal initiators include AIBN and peroxides.

The mixture of the polymerizable monomers may also contain a crosslinking agent, or a combination of crosslinking agents, to increase the shear strength of the adhesive. Useful crosslinking agents include substituted triazines such as 2,4,-bis(trichloromethyl)-6-(4-methoxy phenyl)-s-triazine, 2,4-bis(trichloromethyl)-6-(3,4-dimethoxyphenyl)-s-triazine, and the chromophore-substituted halo-s-triazines disclosed in U.S. Pat. Nos. 4,329,384 and 4,330,590 (Vesley) incorporated herein by reference. Other useful crosslinking agents include multifunctional alkyl acrylate monomers such as trimetholpropane triacrylate, pentaerythritol tetraacrylate, 1,2 ethylene glycol diacrylate, 1,4 butanediol diacrylate, 1,6 hexanediol diacrylate, and 1,12 dodecanol diacrylate. Various other crosslinking agents with different molecular weights between (meth)acrylate functionality would also be useful. Generally, the crosslinker is present in an amount of about 0.005 to 1 weight percent based on the combined weight of the monomers.

Where a foam-like pressure sensitive adhesive tape is desired, a monomer blend containing microspheres may be used. Suitable microspheres are commercially available from Kema Nord Plastics under the trade name "Expancel" and from Matsumoto Yushi Seiyaku under the trade name "Micropearl". When expanded the microspheres have a specific density of approximately 0.02–0.036 g/cc. It is possible to include the unexpanded microspheres in the pressure sensitive adhesive composition and subsequently heat them to cause expansion when they are appropriately processed, but it is generally preferred to mix the expanded microspheres into the adhesive. This process makes it easier to ensure that the hollow microspheres in the final adhesive are substantially surrounded by at least a thin layer of adhesive.

Polymeric microspheres having an average diameter of 10 to 200 micrometers may be blended into the polymerizable composition in amounts from about 15% to about 75% by volume prior to coating. Also useful are glass microspheres having an average diameter of from 5 to 200 micrometers, preferably from about 20 to 80 micrometers. Such microspheres may comprise 5% to 65% by volume of the pressure sensitive adhesive. Both polymeric and glass microspheres are known in the art. The pressure sensitive adhesive layer of the tape should be at least 3 times as thick as the diameter of the microspheres, preferably at least 7 times.

Other tape constructions in which the pressure sensitive adhesives according to the invention are useful include mechanical fasteners such as Dual-Lock™ brand fastener (Minnesota Mining and Manufacturing Co., St. Paul, Minn.) and Scotchmate™ brand fastener (Minnesota Mining and Manufacturing Co., St. Paul, Minn.). The pressure sensitive adhesives are also useful in vibration damping applications.

Other materials which can be blended with the polymerizable monomers prior to coating include plasticizers, tackifiers, coloring agents, reinforcing agents, fire retardants, foaming agents, thermally conductive agents, electrically conductive agents, post-curing agents, and post-curing agent curatives and their accelerators, and the like.

In another preferred embodiment, the adhesive composition also includes electrically conductive materials. Such materials include, but are not limited to, metal particles and spheres such as nickel, gold, copper, or silver particles and spheres and particles coated with conductive coatings such as gold, silver, copper, or nickel coatings on copper spheres, nickel spheres, polymeric spheres or particles, and glass microspheres. Also useful are solder particles such as lead/tin alloys in varying amounts of each metal (available from Sherritt Gordon, Ltd.). Examples of commercially available electrically conductive particles include conductive nickel spheres from Novamet, Inc. Electrically conductive materials are also available from Japan Chemicals, Inc., Potters Industries, and Sherritt Gordon Limited. In a preferred embodiment, the electrically conductive particles have a diameter less than the thickness of the layer of adhesive.

Electrically conductive particles can be used in amounts from about 1% to 10% by volume, and preferably in amounts from about 1% to about 5%, by volume.

For adhesives with electrically conductive particles, the adhesives may be heat activatable instead of pressure sensitive. The amounts and types of co-monomer can be varied to provide pressure-sensitive or heat activatable properties as desired for the end use. Larger amounts of co-monomer will result in less tack and are suitable as heat activatable adhesives while lower amounts are more suitable for pressure-sensitive adhesives. The type of co-monomer can also be varied to obtain desired properties. Monomers such as N-vinyl caprolactam, N-vinyl pyrrolidone, and isobornyl acrylate provide pressure-sensitive properties to an adhesive up to about 40 parts by weight, while amounts above about 40 parts will provide heat activatable adhesives. In addition, even for adhesives without electrically conductive particles, it may be desirable to have a heat activatable adhesive.

When using electrically conductive particles, a preferred embodiment comprises screen printable pressure bondable adhesives that are substantially solvent free acrylic polymers that can be screen printed without requiring the use of additional solvent. As used herein, "pressure bondable" refers to adhesives that are applied to one surface, and will bond to a second surface under pressure. The adhesives include pressure-sensitive adhesives which are tacky are room temperature, and heat activatable adhesives which are substantially non-tacky at room temperature, but will bond at an elevated temperature which is typically in the range of from about 25 C to 200 C.

As used herein, "substantially solvent free" refers to an adhesive that has been prepared without the use of large amounts of solvent. i.e., less than 5% by weight of a coating composition, preferably less than about 2%, and more preferably no additional solvent is added. The preparation of the adhesive includes processes used in the polymerization of the monomers present in the adhesive as well as processes used in coating the adhesive to make finished articles, e.g. pressure-sensitive adhesive tapes. The term "solvent" refers to conventional organic solvents used in the industry which include, for example, toluene, heptane, ethyl acetate, methyl ethyl ketone, acetone, and mixtures thereof.

For screen printing adhesives, a chain transfer agent is usually employed. The chain transfer agents useful in the practice of the invention include, but are not limited to, carbon tetrabromide, n-dodecyl mercaptan, isoctyl thiolglycolate, and mixtures thereof. The chain transfer agent(s) are present in amounts from about 0.01 to about 1 part by weight per 100 parts of acrylate (pph), i.e., 100 parts of the alkyl acrylate and the reinforcing co-monomer, and preferably in amounts from about 0.02 to 0.5 pph. For electrically conductive adhesives it is preferred that the amounts of crosslinking agents and the chain transfer agents is limited so that the adhesive flows sufficiently during bonding so that the conductive particles can come into contact with each other to provide conductive pathways. Preferred heat activated electrically conductive adhesives have a tan delta of greater than 1 at 140 C and above, measured at 1 radian/sec. At these temperatures the adhesives have flow properties similar to a viscous liquid.

For screen printing, the weight average molecular weight of the polymers of the useful adhesive compositions, i.e., syrup, is between about 50,000 and 1,000,000. Preferably, the molecular weight is between about 100,000 and about 800,000, and most preferably, between about 150,000 about 600,000. The lower molecular weights limit the elongational viscosity and result in less stringing of the adhesive during screen printing.

In a preferred embodiment, the adhesive composition also includes a thixotropic agent such as silica to impart thixotropy to the composition. The viscosity of a thixotropic composition decreases when it is subjected to shear stresses so that it flows when it is screen printed. Once the shear stress is removed, the thixotropic material increases rapidly in viscosity so that the printed adhesive essentially does not flow once it has been printed onto a substrate. A suitable silica is commercially available silica under the Cab-O-Sil™ trade name (such as M-5 and TS-720) from Cabot Corp. and Aerosil™ 972 Silica from DeGussa.

The adhesives containing electrically conductive agents of the invention are particularly useful for screen printing directly onto a substrate when it is desired to have adhesive only on select areas of the surface. One such substrate is a flexible electrical circuit. Flexible electrical circuits generally comprise a polymeric film coated with electrically conductive metals such as copper, which has been etched to provide electrically conductive circuit traces. The polymeric films are typically polyimide, although other types of films such as polyester are also used. Suitable flexible circuits are commercially available from such sources as Nippon Graphite, Ltd. Flexible circuits are also described in U.S. Pat. Nos. 4,640,981, 4,659,872, 4,243,455, and 5,122,215. For these types of applications, preferred compositions for the adhesives comprise from about 25 to 95 parts alkyl acrylate monomers and 75 to 1 parts of at least one reinforcing monomer that does not contain acid, and 1% to 10% by volume of electrically conductive particles. Preferably, the co-monomer is isobornyl acrylate and the electrically conductive particles are present in amounts of about 1% to 5% by volume.

Flexible electrical circuits are used in electronic devices where an electrical and mechanical interconnection must be made, such as between two circuit boards, or between a circuit board and a liquid crystal display (LCD). Such connectors are useful in a variety of electronics such as in calculators, computers, pagers, cellular phones, and the like.

The adhesives according to the invention are preferably prepared by photoinitiated bulk polymerization according to the technique described in Martens et al., U.S. Pat. No. 4,181,752, hereby incorporated by reference. The polymerizable monomers and a photoinitiator are mixed together in the absence of solvent and partially polymerized to a viscosity in the range of from about 500 cps to about 50,000 cps to achieve a coatable syrup. Alternatively, the monomers may be mixed with a thixotropic agent such as fumed hydrophilic silica to achieve a coatable thickness. The crosslinking agent and any other ingredients (including any tackifiers) are then added to the prepolymerized syrup. Alternatively, these ingredients (including any tackifiers but with the exception of the crosslinking agent) can be added directly to the monomer mixture prior to pre-polymerization.

The resulting composition is coated onto a substrate (which may be transparent to ultraviolet radiation) and polymerized in an inert (i.e., oxygen free) atmosphere, e.g., a nitrogen atmosphere by exposure to ultraviolet radiation. Examples of suitable substrates include release liners (e.g., silicone release liners) and tape backings (which may be primed or unprimed paper or plastic). A sufficiently inert atmosphere can also be achieved by covering a layer of the polymerizable coating with a plastic film which is substantially transparent to ultraviolet radiation, and irradiating through that film in air as described in the aforementioned Martens et al. patent using ultraviolet lamps. Alternatively, instead of covering the polymerizable coating, an oxidizable tin compound may be added to the polymerizable syrup to increase the tolerance of the syrup to oxygen as described in U.S. Pat. No. 4,303,485 (Levens). The ultraviolet light source preferably has 90% of the emissions between 280 and 400 nm (more preferably between 300 and 400 nm), with a maximum at 351 nm.

Tackifiers may also be added after polymerization of the acrylate monomers.

Where multi-layer tape constructions are desirable, one method of construction is multi-layer coating using conventional techniques. For example, the coatings may be applied concurrently (e.g., through a die coater), after which the entire multi-layer structure is cured all at once. The coatings may also be applied sequentially whereby each individual layer is partially or completely cured prior to application of the next layer.

The compositions of the invention are also useful for damping vibrations when in contact with vibratory parts, especially when the vibratory parts are made of oily metals or polymeric materials. In addition to the adhesives described above, the vibration damping materials of the invention may not be pressure sensitive adhesives. The invention provides both a damping construction comprising at least one layer of an adhesive applied to a vibratory solid article, and a damping construction comprising at least one layer of a viscoelastic material applied to a vibratory solid article.

The invention provides a damping construction comprising at least one layer of a viscoelastic material applied to a vibratory solid article, said viscoelastic material comprising the reaction product of starting materials comprising:

(a) 3–97 parts by weight of an acrylic acid ester of a monohydric alcohol whose homopolymer has a $T_g$ less than 0° C.;

(b) 3–97 parts by weight of a non-polar ethylenically unsaturated monomer whose homopolymer has a solubility parameter of no greater than 10.50 and a $T_g$ greater than 15° C.; and (c) 0–5 parts by weight of a polar ethylenically unsaturated monomer whose homopolymer has a solubility parameter of greater than 10.50 and a $T_g$ greater than 15° C., and substantially no epoxy component. In a preferred embodiment, the starting materials comprise from 25 to 97 parts by weight of component (a), 3 to 75 parts by weight of component (b), and 0 to 5 parts by weight of component (c).

Vibration damping is measured in terms of the loss factor which is a ratio of the energy dissipated to the energy stored. The greater the amount of energy dissipated, the greater the loss factor, and therefore the better the damping properties of the material. Vibration dampers operate over a range of temperatures and the compositions can be formulated to provide optimal damping at a desired range of temperatures.

The compositions can provide materials for vibration dampers that are pressure sensitive at room temperature, or are substantially non-tacky at room temperature, i.e., the sheet would not adhere instantly to a substrate at room temperature under finger pressure. Typically, the compositions having higher amounts of the nonpolar co-monomer having a homopolymer $T_g$ greater than 15° C., i.e., more than about 45–50 parts, depending upon the co-monomer, are not pressure sensitive at room temperature. If desired, a non-tacky damper can be adhered to a substrate by heating the substrate while in contact with the vibration damping sheet material, or the non-tacky damper may be adhered to the substrate with known adhesives, preferably rigid adhesives.

Vibration dampers of the invention are not particularly moisture sensitive and can provide advantages in areas where the damper is exposed to the atmosphere, or where outgassing, usually caused by moisture absorbed by the damper, may be a concern.

In practice, the compositions are typically formed into a sheet or a slab. The thickness of the sheet is determined to a large degree by the application, and useful thicknesses can range from about 0.015 mm to over 2.54 cm. The sheet can be applied to a constraining layer that is stiffer than the sheet to form a composite referred to as a constrained layer damper. Materials suitable for constraining layers are sheets of metal, such as aluminum and steel, and plastics, such as polyester. The constraining layer is generally selected so that the stiffness of the panel is greater than the stiffness, i.e., modulus, of the sheet material. Optimally, although not required, the stiffness of the panel is approximately equal to that of the object to be damped. The sheet can also be applied directly to the object to be damped as a free layer damper.

The vibration damping composites of the invention are particularly useful in automobile construction in which the composites can be applied directly to an automobile panel, such as a door panel, during the stamping stage without requiring cleaning and removal of the mill oils on the panel. During the stamping stage, the metal, usually cold rolled steel or aluminum, is still coated with mill oils used to prevent rust or oxidation.

The sheet materials are also useful as vibration dampers, either as a constrained layer damper or as a free layer damper, for oily engine covers to damp vibrations and reduce the noise from the engine. Sheet materials of the invention are especially advantageous in that they can be applied to the cover without requiring tedious cleaning with solvents and/or detergents to remove the oil. In this application, the sheet materials do not need to be pressure-sensitive and can be applied by heating the engine cover above the $T_g$ of the damper.

The vibration damping materials of the invention are also of use in damping applications where outgassing is of concern. Such applications include computer components such as in suspension dampers for the read/write head, free layer or constrained layer dampers for disk drive covers, or for sealing together the disk drive covers. The vibration dampers of the invention can be made without acid; they may be used advantageously where corrosion is a potential problem, such as on bare copper surfaces.

Other useful applications of the invention include vibration damping for shock absorbers and seismic dampers for buildings. The sheet materials can be die cut to a desired shape, for example a donut shape or a circular disk, or they can be formed in a mold in the desired configuration, such as a molded slab.

The invention will now be further described by way of the following examples.

EXAMPLES

I. Adhesives for Low Energy Surfaces
Test Procedures-Low Energy Surface Adhesion Test procedures used in the examples to evaluate pressure sensitive adhesives useful for adhesion to low energy surfaces include the following.

Monomer Conversion Test (Test Procedure A-I)

The monomer conversion was determined gravimetrically. A sample of the adhesive was weighed after it was coated and subsequently dried at 120 C for 3 hours and then re-weighed. The percent volatiles was taken to be indicative of the monomer conversion.

90° Peel Adhesion Test (Test Procedure B-I)

One-half inch wide strips of the adhesive sample were carefully cut and placed onto the substrate of interest. The adhesive thickness was 5 mils. A 5 mil anodized aluminum backing (0.625 in, wide) was then laminated to the adhesive which is approximately 5 inches long. Test substrates of interest included low energy surfaces such as polypropylene (2"×5"×3/16" natural polypropylene panels from Precision Punch and Plastic, Minneapolis, Minn., with a mask on both sides that is removed prior to cleaning and testing) and polycarbonate (Lexan™ from General Electric Co.), and high energy surfaces such as stainless steel (304-2BA 28 gauge stainless steel with a surface roughness of 2.0±1.0 microinches). A free end of the backing to which the adhesive was laminated extended beyond the test substrate so that it could be clamped to a load cell to determine peel strength.

The sample was rolled back and forth twice with a 2 kg hard rubber roller to ensure contact between the adhesive and the test substrate. The adhesive was then removed after a given dwell time (usually 72 hours unless otherwise noted) at 12"/minute in a 90° peel mode.

The stainless steel substrates were washed once with acetone and 3 times with a 50/50 isopropanol/water mixture prior to testing. The plastic substrates were washed 3 times with heptane prior to testing. The results are reported in lbs/0.5 in. width as the average of 2 tests. All tests were conducted at room temperature.

Shear Test (Test Procedure C-I)

A 0.5 inch strip of tape was adhered to a piece of stainless steel (304-2BA 28 gauge stainless steel with a surface roughness of 2.0±1.0 microinches) which had been cleaned once with acetone and 3 times with 50/50 isopropanol/water such that a one-half square inch overlap was accomplished. A piece of 5 mil anodized aluminum (0.625 in. wide) was then laminated to the entire area of the pressure sensitive adhesive, leaving an additional area to which a load could be applied. The adhesive thickness was 5 mils. The sample was then rolled back and forth twice with a 15 pound roller and allowed to dwell for four hours. The 70° C. samples were allowed to dwell for an additional 10 minutes. After dwelling the sample was tested at either room temperature or 70° C. At room temperature a 1 kg load was applied to the adhesive and the time before the load fell was recorded. At 70° C. a 500 g load was applied to the adhesive and the time before the load fell was recorded. The results are reported as the average of 2 tests.

Comparative Examples-Low Energy Surface Adhesion

Comparative Example C1

A premix was prepared using 90 parts isooctyl acrylate (IOA), 10 parts acrylic acid (AA), and 0.04 parts 2,2-dimethoxy-2-phenylacetophenone photoinitiator (Irgacure™ 651, available from Ciba Geigy Corp.) This mixture was partially polymerized under a nitrogen-rich atmosphere by exposure to ultraviolet radiation to provide a coatable syrup having a viscosity of about 3000 cps. 0.15 parts of 2,6-bis-trichloromethyl-6-(4-methoxphenyl)-s-triazine and an additional 0.16 parts of Irgacure™ 651 were added to the syrup and it was then knife coated onto a silicone-treated polyethylene-coated paper release liner at a thickness of 5 mils. The resulting composite was then exposed to ultraviolet radiation having a spectral output from 300–400 nm with at maximum at 351 nm in a nitrogen-rich environment. An intensity of about 1.0 mW/cm² was used for the first one-third of the exposure time and an intensity of about 2.2 mW/cm² was used for the second two-thirds of exposure time, resulting in a total energy of 250 mJ/cm². The adhesive was then tested according to the test methods listed above and the results are shown in Table I-2. The designation "RT" means room temperature.

Comparative Examples C2 and C3

Comparative example C2 was prepared in the same way as comparative example C1 except that a premix of 94 parts of IOA and 6 parts of AA was used. Comparative example C3 was prepared in the same way as comparative example C1 except that a premix of 100 parts of IOA and 0 parts of AA was used. Comparative examples C2 and C3 were tested according to the test methods listed above and the results are shown in Table I-2.

TABLE I-2

| Ex. | Stainless Steel Peel Strength | Polypropylene Peel Strength | R.T. Shear (Minutes) | 70 Shear (minutes) | Percent Conversion |
|---|---|---|---|---|---|
| C1 | 5.33 | 0.43 | 10,000+ | 10,000+ | >98.5% |
| C2 | 3.73 | 1.29 | 10,000+ | 10,000+ | >98.5% |
| C3 | 1.35 | 1.53 | 2 | 3 | >98.5% |

Examples-Low Energy Surface Adhesion
Examples 1–23

Example 1 was prepared in the same way as comparative example C1 except the premix consisted of 66 parts IOA, 33.5 parts isobornyl acrylate (IBA), and 0.5 parts of AA. In addition, 0.09 parts of 2,6-bis-trichloromethyl-6-(4-methoxyphenyl)-s-triazine were added after the premix was partially polymerized. The composite was exposed to ultraviolet radiation having a spectral output from 300–400 nm with at maximum at 351 nm in a nitrogen-rich environment at an average intensity of about 2.05 mW/cm². The total energy was 650 mJ/cm².

Example 2 was prepared in the same way as Example 1 except a premix consisting of 69 parts IOA, 30 parts IBA, and 1 part AA was used.

Example 3 was prepared in the same way Example 1 except a premix consisting of 65.5 parts IOA, 34.25 parts IBA, and 0.25 parts AA was used.

Example 4 was prepared in the same way as Example 1 except a premix consisting of 65 parts IOA and 35 parts IBA was used and 0.05 parts of 2,5-bis-trichloromethyl-6-(4-methoxyphenyl)-s-triazine was used.

Example 5 was prepared in the same way as Example 4 except a premix of 55 parts IOA and 45 parts (3,3,5-trimethylcyclohexyl acrylate (TMCA) was used.

Example 6 was prepared in the same way as Example 5 except 0.10 parts of 2,6-bis-trichloromethyl-4-(p-methoxyphenyl)-s-triazine was used.

Example 7 was prepared in the same way as Example 1 except a premix of 72 parts of IOA, 27 parts of IBA, and 1 part of AA was used.

Example 8 was prepared in the same way as Example 1 except a premix of 66 parts of IOA, 33 parts of IBA, and 1 part of AA was used.

Example 9 was prepared in the same way as Example 1 except a premix of 63 parts of IOA, 36 parts of IBA, and 1 part of AA was used.

Example 10 was prepared in the same way as Example 1 except a premix of 70.75 parts of IOA, 29 parts of TMCA, and 0.25 parts of AA was used.

Example 11 was prepared in the same way as Example 1 except a premix of 64.5 parts of IOA, 35 parts of TMCA, and 0.5 parts of AA was used.

Example 12 was prepared in the same way as Example 1 except a premix of 49 parts of IOA, 51.5 parts of cyclohexyl acrylate (CHA), and 0.5 parts of AA was used.

Example 13 was prepared in the same way as Example 1 except a premix of 80 parts of IOA, 19.5 parts of N-octylacrylamide (NOA), and 0.5 parts of AA was used.

Example 14 was prepared in the same way as Example 6 except a premix of 90 parts IOA, 10 parts IBA, and 0.5 parts AA was used.

Example 15 was prepared in the same way as Example 6 except a premix of 80 parts IOA, 20 parts IBA, and 0.5 parts AA was used.

Example 16 was prepared in the same way as Example 6 except a premix of 70 parts IOA, 30 parts IBA, and 0.5 parts AA was used.

Example 17 was prepared in the same way as Example 6 except a premix of 90 parts IOA, 10 parts TMCA, and 0.5 parts AA was used.

Example 18 was prepared in the same way as Example 6 except a premix of 80 parts IOA, 20 parts TMCA, and 0.5 parts AA was used.

Example 19 was prepared in the same way as Example 6 except a premix of 70 parts IOA, 30 parts TMCA, and 0.5 parts AA was used.

Example 20 was prepared in the same way as Example 6 except a premix of 60 parts IOA, 40 parts TMCA, and 0.5 parts AA was used.

Example 21 was prepared in the same way as Example 6 except a premix of 55 parts IOA, 45 parts TMCA, and 0.5 parts AA was used.

Example 22 was prepared in the same way as Example 6 except a premix of 50 parts IOA, 50 parts CHA, and 0.5 parts AA was used.

Example 23 was prepared in the same way as Example 6 except a premix of 45 parts IOA, 55 parts CHA, and 0.5 parts AA was used.

The data of Examples 1–23 are shown in Table I-3. In the table "St. St." refers to stainless steel. The designation "n.t." means not tested. The designation "RT" means room temperature. The designation "(½)" means that 1 of the 2 samples tested passed the test. The samples for peel testing in Examples 4 and 5 were prepared using a 15 lb. roller. A 24 hr. dwell period was used. Because Examples 13, 14, 17, 18, 22, and 23 do not meet the minimum peel adhesion requirement, they are included here as further comparative examples.

TABLE I-3

| Ex. | St.St. | Polyprop. | Polycarb. | RT Shear | 70 C Shear | % Conv. |
|---|---|---|---|---|---|---|
| 1 | 3.10 | 3.11 | 4.93 | 10K+ | 10K+ | >98.5% |
| 2 | 3.34 | 2.62 | 4.29 | 10K+ | 10K+ | >98.5% |
| 3 | 3.41 | 3.35 | 4.39 | 10K+ | 10K+ | >98.5% |
| 4 | 3.50 | 2.80 | 4.81 | 1409 | 51 | >98.5% |
| 5 | 3.08 | 2.74 | nt | 2960 | 143 | >98.5% |
| 6 | 3.22 | 2.45 | 4.20 | 1138 | 324 | >98.5% |
| 7 | 3.28 | 2.48 | nt | 10K+ | 10K+ | >98.5% |
| 8 | 3.21 | 2.04 | nt | 10K+ | 10K+ | >98.5% |
| 9 | 3.14 | 2.12 | nt | 10K+ | 10K+ | >98.5% |
| 10 | 3.18 | 2.43 | nt | 3375 | 10K+ | >98.5% |
| 11 | 2.39 | 2.08 | 2.92 | 10K+ | 10K+ | >98.5% |
| 12 | 3.56 | 2.52 | 3.68 | 3960 | 10K+ | >98.5% |
| 13 | 2.10 | 1.71 | 2.61 | 2334 | 10K+ | >98.5% |
| 14 | 1.49 | 1.57 | nt | 1207 | 10K+ (1/2) | >98.5% |
| 15 | 1.84 | 1.85 | nt | 3133 | 10K+ | >98.5% |
| 16 | 2.23 | 2.28 | nt | 10K+ (1/2) | 2058 | >98.5% |
| 17 | 1.65 | 1.87 | nt | 1103 | 10K+ | >98.5% |
| 18 | 1.65 | 1.89 | nt | 3747 | 10K+ | >98.5% |
| 19 | 1.89 | 2.16 | nt | 10K+ (1/2) | 10K+ | >98.5% |
| 20 | 2.31 | 2.41 | nt | 10K+ | 10K+ | >98.5% |
| 21 | 1.90 | 2.69 | nt | 10K+ | 10K+ | >98.5% |
| 22 | 2.87 | 1.18 | nt | 10K+ | 10K+ | >98.5% |
| 23 | 3.53 | 0.95 | nt | 10K+ | 10K+ | >98.5% |

The data of Table I-3 shows that the adhesion to low energy surfaces like polypropylene can be increased without decreasing the adhesion to high energy surface such as stainless steel as was observed in the comparative examples of Table I-2. In addition the data of Table I-3 shows that desirable cohesive strength properties can also be achieved in the pressure sensitive adhesives of this invention.

II. Adhesives for Oily Surface Adhesion

Test Procedures-Oily Surface Adhesion

Test procedures used in the examples to evaluate pressure sensitive adhesives useful for adhesion to oily surfaces include the following.

Monomer Conversion Test (Test Procedure A-II)

The monomer conversion was determined gravimetrically. 3 in. by 3 in. samples were laminated to a piece of aluminum foil, weighed, and placed in a forced air oven at 250° F. for 90 min. Samples were then equilibrated at room temperature and reweighed for weight loss. The percent volatiles was taken to be indicative of the monomer conversion.

90° Peel Adhesion Test (Test Procedure B-II)

One-half inch wide pieces of samples were cut out and laminated to 5 mil thick anodized aluminum which was 0.625 in. wide. The adhesive thickness was 5 mils. The release liner was then removed from the adhesive and the samples were placed onto either a stainless steel substrate (304 stainless steel with a #7 finish) or a cold rolled steel substrate (20 gauge cold plate CRS 1018 with mill finish). The stainless steel substrate was cleaned prior to application of adhesive by wiping once with acetone and 3 times with heptane. The cold rolled steel substrate was cleaned prior to application of adhesive by wiping once with acetone.

Prior to application of the adhesive, an excess of mineral oil was applied to each cold rolled steel substrate with a small piece of cheese cloth and then removed to leave a coating of oil that was 1.5±0.25 mg/in.$^2$. A free end of the backing to which the adhesive was laminated extended beyond the test substrate so that it could be clamped to a load cell to determine peel strength. The sample was rolled back and forth twice with a 4.5 lb roller to ensure contact between the adhesive and the test substrate. The adhesive was then removed after a given dwell time (10 sec., 1 minute, or 24 hours) at 12"/minute in a 90° peel mode.

The values reported are in oz/0.5 in. and represent the average peel values (based on two tests) obtained between 1 and 4 inches on a 5 inch peel sample. All tests were done at room temperature.

Shear Test (Test Procedure C-II)

One-half inch wide pieces of samples were cut out and laminated to 5 mil thick anodized aluminum which was 0.625 in. wide. This construction was placed on stainless steel panels (304 stainless steel with a #7 finish) that had been cleaned by wiping once with acetone and 3 times with heptane. Placement was such that a 1.0 in.×0.5 in. adhesive sample (adhesive thickness=5 mils) was in contact with the panel. The adhesive sample was rolled back and forth twice with a 4.5 lb roller, with some excess material overhanging the sample for attachment of the weight. The samples were then allowed to dwell for 24 hours before the weight was hung on the samples. The 70° C. samples were further allowed to dwell for an additional 10 minutes in the oven before the weight was applied. For the room temperature samples, a 1000 g weight was used, whereas for the 70° C. samples a 500 g weight was used.

The shear data are reported in minutes until the weight fell and represent the average of two tests.

Phase Separation (Test Procedure D-II)

The presence or absence of phase separation was judged by the optical clarity of the resulting polyacrylate/tackifier blend. The visual observation of opacity was taken to be indicative of a phase separation.

Comparative Examples-Oily Surface Adhesion

Comparative Example C1

94 parts iso-octyl acrylate (IOA) and 6 parts acrylic acid (AA) were mixed together in a jar under a constant nitrogen purge along with 0.4 parts of 2,2-dimethoxy-2-phenylacetophenone photoinitiator (Irgacure™ 651, available from Ciba Geigy Corp.) This mixture was partially polymerized under a nitrogen-rich atmosphere to provide a coatable syrup having a viscosity of about 3000 cps. 0.16 parts of 2,4-bis(trichloromethyl)-6-(3,4-dimethoxyphenyl)-s-triazine and an additional 0.16 parts of Irgacure™ 651 were added to the syrup and it was then knife coated onto a release coated paper backing at a thickness of 5 mils. The resulting coating was then exposed to ultraviolet radiation having a spectral output from 300–400 nm with a maximum at 351 nm in a nitrogen-rich environment. An intensity of about 2.05 mW/cm$^2$ was used for a total dosage of 650 mJ/cm$^2$. The resulting adhesive was then tested according to the test methods listed.

Comparative Examples C2 and C3

Comparative example C2 was prepared in the same way as comparative example C1 except that a premix of 10 parts AA and 90 parts IOA was used. In addition, 0.12 parts triazine was used. Comparative example C3 was prepared in the same way as comparative example C1 except that a premix of 14 parts AA and 86 parts IOA was used.

Examples-Oily Surface Adhesion

Examples 1–20

Example 1 was prepared in the same way as comparative example C1 except the premix consisted of 25 parts N-octyl acrylamide (NOA) and 75 parts lauryl acrylate (LA). The NDA was heated to about 40 C prior to syruping and coating. In addition, 0.08 parts of 2,4-bis-trichloromethyl-6-(3,4-dimethoxyphenyl)-s-triazine were added after the premix was partially polymerized.

Example 2 was prepared in the same way as example 1 except that the premix consisted of 35 parts NOA and 65 parts LA. The NOA was heated to about 40° C. prior to syruping and coating. In addition, 0.12 parts of 2,4-bis-trichloromethyl-6-(3,4-dimethoxyphenyl)-s-triazine were added after the premix was partially polymerized.

Example 3 was prepared in the same way as example 1 except that the premix consisted of 45 parts NOA and 55 parts LA. The NOA was heated to about 40° C. prior to syruping and coating.

Example 4 was prepared in the same way as example 1 except that the premix consisted of 25 parts iso-bornyl acrylate (IBA) and 75 parts IOA.

Example 5 was prepared in the same way as example 1 except that the premix consisted of 30 parts IBA and 70 parts LA.

Example 6 was prepared in the same way as example 1 except that the premix consisted of 40 parts IBA and 60 parts LA. In addition, 0.12 parts of 2,6-bis-trichloromethyl-6-(3,4-dimethoxyphenyl)-s-triazine were added after the premix was partially polymerized.

Example 7 was prepared in the same way as example 1 except that the premix consisted of 30 parts IBA and 70 parts iso-decyl acrylate (IDA).

Example 8 was prepared in the same way as example 1 except that the premix consisted of 40 parts IBA and 60 parts IDA. In addition, 0.12 parts of 2,4-bis-trichloromethyl-6-(3,4-dimethoxyphenyl)-s-triazine were added after the premix was partially polymerized.

Example 9 was prepared in the same way as example 1 except that the premix consisted of 40 parts IBA, 15 parts IOA, and 45 parts LA. In addition, 0.12 parts of 2,4-bis-trichloromethyl-6-(3,4-dimethoxyphenyl)-s-triazine were added after the premix was partially polymerized.

Example 10 was prepared in the same way as example 1 except that the premix consisted of 35 parts NOA, 15 parts IOA, and 50 parts LA. The NOA was heated to about 40° C. prior to syruping and coating. In addition, 0.12 parts of 2,4-bis-trichloromethyl-6-(3,4-dimethoxyphenyl)-s-triazine were added after the premix was partially polymerized.

Example 11 was prepared in the same way as example 1 except that the premix consisted of 35 parts NOA, 35 parts IOA, and 30 parts LA. The NOA was heated to about 40 C prior to syruping and coating. In addition, 0.12 parts of 2,4-bis-trichloromethyl-6-(3,4-dimethoxyphenyl)-s-triazine were added after the premix was partially polymerized.

Example 12 was prepared in the same way as example 1 except that the premix consisted of 35 parts NOA, 45 parts IOA, and 20 parts LA. The NOA was heated to about 40° C. prior to syruping and coating. In addition, 0.12 parts of 2,4-bis-trichloromethyl-6-(3,4-dimethoxyphenyl)-s-triazine were added after the premix was partially polymerized.

Example 13 was prepared in the same way as example 1 except that the premix consisted of 35 parts IBA, 15 parts IOA, and 50 parts octadecyl acrylate (ODA). In addition, 0.12 parts of 2,4-bis-trichloromethyl-6-(3,4-dimethoxyphenyl)-s-triazine were added after the premix was partially polymerized.

Example 14 was prepared in the same way as example 1 except that the premix consisted of 35 parts IBA, 35 parts IOA, and 30 parts ODA. In addition, 0.12 parts of 2,4-bis-trichloromethyl-6-(3,4-dimethoxyphenyl)-s-triazine were added after the premix was partially polymerized.

Example 15 was prepared in the same way as example 1 except that the premix consisted of 35 parts IBA, 45 parts IOA, and 20 parts ODA. In addition, 0.12 parts of 2,4-bis-trichloromethyl-6-(3,4-dimethoxyphenyl)-s-triazine were added after the premix was partially polymerized.

Example 16 was prepared in the same way as example 1 except that the premix consisted of 30 parts NOA, 40 parts IOA, and 30 parts ODA. The NOA was heated to about 40° C. prior to syruping and coating. In addition, 0.12 parts of 2,4-bis-trichloromethyl-6-(3,4-dimethoxyphenyl)-s-triazine were added after the premix was partially polymerized.

Example 17 was prepared in the same way as example 1 except that the premix consisted of 67 parts IOA, 32.5 parts IBA, and 0.5 parts AA. In addition, 0.12 parts of 2,4-bis-trichloromethyl-6-(3,4-dimethoxyphenyl)-s-triazine were added after the premix was partially polymerized.

Example 18 was prepared in the same way as example 1 except that the premix consisted of 69 parts IOA, 30 parts IBA, and 1 part AA. In addition, 0.12 parts of 2,4-bis-trichloromethyl-6-(3,4-dimethoxyphenyl)-s-triazine were added after the premix was partially polymerized.

Example 19 was prepared in the same way as example 1 except that the premix consisted of was 71 parts IOA, 27 parts IBA, and 2 parts AA. In addition, 0.12 parts of 2,4-bis-trichloromethyl-6-(3,4-dimethoxyphenyl)-s-triazine were added after the premix was partially polymerized.

Example 20 was prepared in the same way as example 1 except that the premix consisted of 76 parts IOA, 21 parts IRA, and 3 parts AA. In addition, 0.12 parts of 2,4-bis-trichloromethyl-6-(3,4-dimethoxyphenyl)-s-triazine were added after the premix was partially polymerized.

The data of Examples 1–20, as well as comparative examples C1, C2, and C3, are shown in Table II-2. The designation "DNS" means the adhesive did not stick to the substrate. The designation "nt" means not tested.

90° Peel Adhesion Test (Test Procedure B1-III)

One-half inch wide strips of a 5 mil adhesive sample were carefully cut and placed onto the substrate of interest. A 5 mil anodized aluminum backing, 0.625 in. wide, was then laminated to the adhesive which is approximately 5 inches long. Test substrates of interest included low energy surfaces such as polypropylene (2"×5"×3/16" natural polypropylene panels available from Precision Punch and Plastic, Minneapolis, Minn., having a mask on both sides that is removed prior to cleaning and testing) and polycarbonate (Lexan™ available from General Electric Co.), and high energy surfaces such as stainless steel (304-2BA 28 gauge stainless steel with a surface roughness of 2.0±1.0 microinches). A free end of the backing to which the adhesive was laminated extended beyond the test substrate so that it could be clamped to a load cell to determine peel strength. The sample was rolled twice back and forth with a 2 kg hard

TABLE II-2

| Example | Stainless Steel Peel Strength 24 Hour | 10 Second Peel Cold Rolled Steel | 1 Min Peel Cold Rolled Steel | RT Shear Minutes | 70 C Shear Minutes | Percent Conversion |
|---|---|---|---|---|---|---|
| 1 | 24.1 | 8.6 | 14.3 | 68 | nt | >97 |
| 2 | 31.4 | 6.2 | 11.8 | 169 | nt | >97 |
| 3 | 52.7 | 6.7 | 12.2 | 381 | nt | >97 |
| 4 | 42.4 | 4.3 | 11.9 | 292 | nt | >97 |
| 5 | 20.5 | 2.3 | 15.5 | 30 | nt | >97 |
| 6 | 27.0 | 5.8 | 10.1 | 214 | nt | >97 |
| 7 | 38.2 | 6.5 | 11.6 | 243 | nt | >97 |
| 8 | 44.2 | 4.0 | 10.4 | 741 | nt | >97 |
| 9 | 37.3 | 3.7 | 10.7 | 185 | nt | >97 |
| 10 | 32.3 | 6.5 | 12.4 | 135 | nt | >97 |
| 11 | 43.0 | 5.4 | 11.6 | 210 | nt | >97 |
| 12 | 42.9 | 3.8 | 12.3 | 758 | nt | >97 |
| 13 | 11.5 | 2.8 | 10.3 | 12 | nt | >97 |
| 14 | 13.4 | 5.1 | 10.8 | 177 | nt | >97 |
| 15 | 20.3 | 5.2 | 8.6 | 186 | nt | >97 |
| 16 | 22.5 | 5.1 | 7.7 | 195 | nt | >97 |
| 17 | 36.0 | 4.1 | 6.0 | 997 | 10K+ | >97 |
| 18 | 38.7 | 3.1 | 6.5 | 1465 | 10K+ | >97 |
| 19 | 47.7 | 1.0 | 4.3 | 8318 | 10K+ | >97 |
| 20 | 39.1 | 0.8 | 2.0 | 10K+ | 10K+ | >97 |
| C1 | 51.2 | 0(DNS) | 0(DNS) | 10K+ | nt | >97 |
| C2 | 37.6 | 0(DNS) | 0(DNS) | 10K+ | nt | >97 |
| C3 | 61.5 | 0(DNS) | 0.7 | 10K+ | nt | >97 |

III. Tackified Pressure Sensitive Adhesives

Test Procedures-Tackified Pressure Sensitive Adhesives

Test procedures used in the examples to evaluate tackified pressure sensitive adhesives include the following.

Monomer Conversion Test (Test Procedure A1-III)

The monomer conversion was determined gravimetrically. A sample of the adhesive was weighed after it was coated and subsequently dried at 120° C. for 3 hours and then re-weighed. The percent volatiles was taken to be indicative of the monomer conversion.

Monomer Conversion Test (Test Procedure A2-III)

The monomer conversion was determined gravimetrically. 3 in. by 3 in. samples were laminated to a piece of aluminum foil, weighed, and placed in a forced air oven at 250° F. for 90 min. Samples were then equilibrated at room temperature and re-weighed for weight loss. The percent volatiles was taken to be indicative of the monomer conversion.

rubber roller to ensure contact between the adhesive and the test substrate. The adhesive was then removed after a given dwell time (usually 72 hours unless otherwise noted) at 12"/minute in a 90° peel mode. The peel data are reported in lbs/0.5 in. width. and represent the average of two tests.

The stainless steel substrates were washed once with acetone and 3 times with a 50/50 isopropanol/water mixture prior to testing. The plastic substrates were washed 3 times with heptane prior to testing.

90° Peel Adhesion Test (Test Procedure B2-III)

One-half inch wide pieces of samples were cut out and laminated to 5 mil thick anodized aluminum which was 0.625 in. wide. The adhesive thickness was 5 mils. The release liner was then removed from the adhesive and the samples were placed onto either a stainless steel substrate (304 stainless steel with a #7 finish) or a cold rolled steel substrate (20 gauge cold plate CRS 1018 with mill finish). The stainless steel substrate was cleaned prior to application of adhesive by wiping once with acetone and 3 times with heptane. The cold rolled steel substrate was cleaned prior to application of adhesive by wiping once with acetone.

Prior to application of the adhesive, an excess of mineral oil was applied to each cold rolled steel substrate with a small piece of cheese cloth and then removed to leave a coating of oil that was 1.5±0.25 mg/in.$^2$. A free end of the backing to which the adhesive was laminated extended beyond the test substrate so that it could be clamped to a load cell to determine peel strength. The sample was rolled back and forth twice with a 4.5 lb roller to ensure contact between the adhesive and the test substrate. The adhesive was then removed after a given dwell time (10 sec., 1 minute, or 24 hours) at 12"/minute in a 90° peel mode.

The values reported are in oz/0.5 in. and represent the average peel values (based on two tests) obtained between 1 and 4 inches on a 5 inch peel sample. All tests were done at room temperature.

Shear Test (Test Procedure C1-III)

A 0.5 inch strip of tape was adhered to a piece of stainless steel (304 stainless steel with a #7 finish) which had been cleaned once with acetone and 3 times with 50/50 isopropanol/water such that a one-half square inch overlap was accomplished. A piece of 5 mil anodized aluminum was then laminated to the entire area of the pressure sensitive adhesive, leaving an additional area to which a load could be applied. The thickness of the adhesive was 5 mils. The sample was then rolled twice back and forth with a 15 pound roller and allowed to dwell for four hours. The 70° C. samples were further allowed to dwell for 10 minutes at 70° C. After dwelling the sample was tested at either room temperature or 70° C. At room temperature a 1 kg load was applied to the adhesive and the time before the load fell was recorded. At 70° C. a 500 g load was applied to the adhesive and the time before the load fell was recorded.

The shear data are reported in minutes and represent the average of two tests.

Shear Test (Test Procedure C2-III)

One-half inch wide pieces of samples were cut out and laminated to 5 mil thick anodized aluminum which was 0.625 in. wide. This construction was placed on stainless steel panels (304 stainless steel with a #7 finish) that had been cleaned by wiping once with acetone and 3 times with heptane. Placement was such that a 1.0 in.×0.5 in. adhesive sample (adhesive thickness=5 mils) was in contact with the panel. The adhesive sample was rolled back and forth twice with a 4.5 lb roller, with some excess material overhanging the sample for attachment of the weight. The samples were then allowed to dwell for 24 hours before the weight was hung on the samples. The 70° C. samples were further allowed to dwell for an additional 10 minutes in the oven before the weight was applied. For the room temperature samples, a 1000 g weight was used, whereas for the 70° C. samples a 500 g weight was used.

The shear data are reported in minutes until the weight fell and represent the average of two tests.

Phase Separation (Test Procedure D-III)

The presence or absence of phase separation was judged by the optical clarity of the resulting polyacrylate/tackifier blend. The visual observation of opacity was taken to be indicative of a phase separation.

Examples-Tackified Pressure Sensitive Adhesive

Examples 1–56

Example 1:

100 parts by weight of iso-octyl acrylate (IOA), isobornyl acrylate (IBA), and acrylic acid (AA) with a monomer ratio of 80/19.5/0.5 (IOA/IBA/AA) was blended with 0.04 parts of benzildimethylketal (KB-1, SARTOMER Company) photoinitiator and photopolymerized with an ultraviolet light source under a constant nitrogen purge to a viscosity of about 2000 cps. 0.16 parts of additional benzildimethylketal photoinitiator, 0.15 parts of 2,4-bis(trichloromethyl)-6-(4-methoxyphenyl), and 20 parts of Regalrez 1085 tackifier resin (Hercules Co.) were added to the acrylate syrup and mixed until all of the components had completely dissolved. After mixing, the blend was knife-coated at a 5 mil thickness onto a silicone-treated polyethylene-coated paper release liner. The composite was then exposed to ultraviolet radiation having a spectral output from 300–400 with a maximum at 351 nm in a nitrogen-rich environment. The average intensity was about 2.05 mW/cm$^2$. resulting in a total energy of 650 mJ/cm$^2$.

Example 2 was prepared in the same way as Example 1 except 40 parts of Regalrez 1085 tackifier was used.

Example 3 was prepared in the same way as Example 1 except Regalrez 1094 tackifier (Hercules Co.) was used.

Example 4 was prepared in the same way as Example 1 except 40 parts of Regalrez 1094 tackifier was used.

Example 5 was prepared in the same way as Example 1 except Regalrez 1128 tackifier (Hercules Co.) was used.

Example 6 was prepared in the same way as Example 1 except 40 parts of Regalrez 1128 tackifier was used.

Example 7 was prepared in the same way as Example 1 except Regalrez 6108 tackifier (Hercules Co.) was used.

Example 8 was prepared in the same way as Example 1 except 40 parts of Regalrez 6108 tackifier was used.

Example 9 was prepared in the same way as Example 1 except Regalrez 3102 tackifier (Hercules Co.) was used.

Example 10 was prepared in the same way as Example 1 except 40 parts of Regalrez 3102 tackifier was used.

Example 11 was prepared in the same way as Example 1 except Regalrez 5095 tackifier (Hercules Co.) was used.

Example 12 was prepared in the same way as Example 1 except 40 parts of Regalrez 5095 tackifier was used.

Example 13 was prepared in the same way as Example 1 except Escorez 5340 tackifier (Exxon Co.) was used.

Example 14 was prepare in the same way as Example 1 except 40 parts of Escorez 5340 tackifier was used.

Example 15 was prepared in the same way as Example 1 except Arakawa KE-311 tackifier (Arakawa) was used.

Example 16 was prepared in the same way as Example 1 except 40 parts of Arakawa KE-311 tackifier was used.

Example 17 was prepared in the same way as Example 1 except Escorez 5300 tackifier (Exxon Co.) was used.

Example 18 was prepared in the same way as Example 1 except 40 parts of Escorez 5300 tackifier was used.

Example 19 was prepared in the same way as Example 1 except Arkon E90 tackifier (Arakawa) was used.

Example 20 was prepared in the same way as Example 1 except 40 parts of Arkon E90 tackifier was used.

Example 21 was prepared in the same way as Example 1 except Arkon P115 tackifier (Arakawa) was used.

Example 22 was prepared in the same way as Example 1 except 40 parts of Arkon P115 tackifier was used.

Example 23 was prepared in the same way as Example 1 except Regalite 90 tackifier (Hercules Co.) was used.

Example 24 was prepared in the same way as Example 1 except 40 parts of Regalite 90 tackifier was used.

Example 25 was prepared in the same way as Example 1 except Exxon ECR 165B tackifier was used.

Example 26 was prepared in the same way as Example 1 except 40 parts of to Exxon ECR 165B tackifier was used.

Example 27 was prepared in the same way as Example 1 except Exxon ECR 177 tackifier was used.

Example 28 was prepared in the same way as Example 1 except 40 parts of Exxon ECR 177 tackifier was used.

Example 29 was prepared in the same way as Example 1 except Arkon M100 tackifier (Arakawa) was used.

Example 30 was prepared in the same way as Example 1 except 40 parts of Arkon M100 tackifier was used.

Example 31 was prepared in the same way as Example 1 except Arkon M90 tackifier (Arakawa) was used.

Example 32 was prepared in the same way as Example 1 except 40 parts of Arkon M90 tackifier was used.

Example 33 was prepared in the same way as example 1 except Hercotac RT110 tackifier (Hercules Co.) was used.

Example 34 was prepared in the same way as Example 1 except 40 parts of Hercotac RT110 tackifier was used.

Example 35 was prepared in the same way as example 1 except Escorez 5380 tackifier (Exxon Co.) was used.

Example 36 was prepared in the same way as Example 1 except 40 parts of Escorez 5380 tackifier was used.

Example 37 was prepared in the same way as Example 1 except Foral 85 tackifier (Hercules Co.) was used.

Example 38 was prepared in the same way as Example 1 except 40 parts of Foral 85 tackifier was used.

Example 39 was prepared in the same way as Example 1 except Kristalex 5140 tackifier (Hercules Co.) was used.

Example 40 was prepared in the same way as Example 2 except 40 parts of Kristalex 5140 tackifier was used.

Example 41 was prepared in the same way as Example 1 except Hercotac 100S tackifier (Hercules Co.) was used.

Example 42 was prepared in the same way as Example 1 except 40 parts of Hercotac 100S tackifier was used.

Example 43 was prepared in the same way as Example 1 except Regalite 355 tackifier (Hercules Co.) was used.

Example 44 was prepared in the same way as Example 1 except 40 parts of Regalite 355 tackifier was used.

Example 45 was prepared in the same way as Example 1 except Wingtack Plus tackifier (Goodyear Co.) was used.

Example 46 was prepare in the same way as Example 1 except 40 parts of Wingtack Plus tackifier was used.

Example 47 was prepared in the same way as Example 1 except Hercotac RT 400 tackifier (Hercules Co.) was used.

Example 48 was prepared in the same way as Example 1 except 40 parts of Hercotac RT 400 tackifier was used.

Example 49 was prepared in the same way as Example 1 except Piccotac HM2162 tackifier (Hercules Co.) was used.

Example 50 was prepared in the same way as Example 1 except 40 parts of Piccotac HM2162 tackifier was used.

Example 51 was prepared in the same way as Example 1 except Kristalex 3100 tackifier (Hercules Co.) was used.

Example 52 was prepared in the same way as Example 1 except 40 parts of Kristalex 3100 tackifier was used.

Example 53 was prepared in the same way as Example 1 except Kristalex 1120 tackifier (Hercules Co.) was used.

Example 54 was prepared in the same way as Example 1 except 40 parts of Kristalex 1120 tackifier was used.

Example 55 was prepared in the same way as Example 1 except Piccolyte A135 tackifier (Hercules Co.) was used.

Example 56 was prepared in the same way as Example 1 except 40 parts of Piccolyte A135 tackifier was used.

The inhibition factor and phase separation characteristics of the above examples are shown in Table III-2. The polypropylene peel strength of several samples were determined according to Test Procedure B1-III and are reported in Table III-2 as well. If the samples possessed an inhibition factor greater than 1.0 the sample was dried in a 120 C oven to reduce the inhibition factor below 1 prior to testing. The designation "nt" means not tested. The designation "na" means not applicable. The designation "nc" means not conclusive.

TABLE III-2

| Example | Inhibition Factor | Phase separation | Polypropylene peel strength (lb/0.5") |
|---|---|---|---|
| 1 | 0.06 | no | nt |
| 2 | 0.11 | no | nt |
| 3 | 0.14 | no | nt |
| 4 | 0.37 | yes | 3.37 |
| 5 | 0.16 | yes | 3.20 |
| 6 | 0.54 | yes | 2.71 |
| 7 | 0.19 | no | 2.48 |
| 8 | 0.40 | no | 1.52 |
| 9 | 0.20 | no | 2.78 |
| 10 | 0.39 | no | 1.07 |
| 11 | 0.34 | no | nt |
| 12 | 0.80 | no | nt |
| 13 | 0.46 | yes | nt |
| 14 | 1.06 | yes | nt |
| 15 | 0.51 | no | 2.53 |
| 16 | 1.42 | no | 3.90 |
| 17 | 0.73 | yes | nt |
| 18 | 1.30 | yes | nt |
| 19 | 0.74 | no | 4.29 |
| 20 | 1.25 | no | 1.90 |
| 21 | 0.76 | yes | 3.01 |
| 22 | 1.31 | no | 3.60 |
| 23 | 0.78 | no | nt |
| 24 | 1.33 | no | nt |
| 25 | 0.80 | yes | nt |
| 26 | 1.33 | Yes | nt |
| 27 | 0.81 | yes | nt |
| 28 | 1.22 | yes | nt |
| 29 | 0.89 | no | 2.93 |
| 30 | 1.89 | no | 3.90 |
| 31 | 0.96 | no | 2.72 |
| 32 | 1.88 | no | 4.04 |
| 33 | 1.25 | no | 1.26 |
| 34 | 3.11 | yes | 0.79 |
| 35 | 1.34 | yes | nt |
| 36 | 2.42 | yes | nt |
| 37 | 1.52 | no | nt |
| 38 | 2.83 | no | nt |
| 39 | 1.61 | nc | nt |
| 40 | 2.71 | nc | 0.69 |
| 41 | 1.66 | no | 2.29 |
| 42 | 4.58 | no | 2.10 |
| 43 | 2.25 | no | 5.14 |
| 44 | 2.99 | no | 2.94 |
| 45 | 2.34 | no | 3.06 |
| 46 | 5.74 | no | 5.33 |
| 47 | 2.68 | no | 2.90 |
| 48 | 5.95 | no | 0.72 |
| 49 | 2.94 | no | 2.82 |
| 50 | 6.50 | no | 3.98 |
| 51 | 3.03 | nc | nt |
| 52 | 4.11 | nc | 0.55 |
| 53 | >6.5 | na | nt |
| 54 | >6.5 | na | nt |
| 55 | >6.5 | na | nt |
| 56 | >6.5 | na | nt |

The data of Table III-2 shows that several commercial tackifiers are soluble in the non-polar acrylate pressure sensitive adhesive matrix but that only the Regalrez tackifying resins have low inhibition factors as well.

Examples 57–115

Example 57 was prepared in the same way as Example 1 except an 85/15/0 IOA/IBA/AA monomer ratio was used.

Example 58 was prepared in the same way as Example 57 except 40 parts of Regalrez 1085 tackifier was used.

Example 59 was prepared in the same way as Example 1 except an 85/14/1 IOA/IBA/AA monomer ratio was used.

Example 60 was prepared in the same way as Example 1 except an 85/13/2 IOA/IBA/AA monomer ratio was used.

Example 61 was prepared in the same way as Example 1 except an 85/11/4 IOA/IBA/AA monomer ratio was used.

Example 62 was prepared in the same way as Example 57 except 20 parts of Regalrez 6108 tackifier was used.

Example 63 was prepared in the same way as Example 62 except 40 parts of Regalrez 6108 tackifier was used.

Example 64 was prepared in the same way as Example 62 except an IOA/IBA/AA ratio of 85/14/1 was used.

Example 65 was prepared in the same way as Example 64 except 40 parts of Regalrez 6108 tackifier was used.

Example 66 was prepared in the same way as Example 64 except an IOA/IBA/AA ratio of 85/13/2 was used.

Example 67 was prepared in the same way as Example 66 except an IOA/IBA/AA ratio of 85/12/3 was used.

Example 68 was prepared in the same way as Example 57 except 20 parts of Regalrez 3102 tackifier was used.

Example 69 was prepared in the same way as Example 68 except 40 parts of Regalrez 3102 tackifier was used.

Example 70 was prepared in the same way as Example 68 except an IOA/IBA/AA ratio of 85/14/1 was used.

Example 71 was prepared in the same way as Example 70 except 40 parts of Regalrez 3102 tackifier was used.

Example 72 was prepared in the same way as Example 70 except an IOA/IBA/AA ratio of 85/13/2 was used.

Example 73 was prepared in the same way as Example 72 except an IOA/IBA/AA ratio of 85/12/3 was used.

Example 74 was prepared in the same way as Example 57 except 20 parts of Regalrez 1094 tackifier was used.

Example 75 was prepared in the same way as Example 74 except 40 parts of Regalrez 1094 tackifier was used.

Example 76 was prepared in the same way as Example 74 except an IOA/IBA/AA ratio of 85/14/1 was used.

Example 77 was prepared in the same way as Example 74 except an IOA/IBA/AA ratio of 85/13/2 was used.

Example 78 was prepared in the same way as Example 57 except an IOA/IBA/AA ratio of 90/9/1 was used.

Example 79 was prepared in the same way as Example 78 except an IOA/IBA/AA ratio of 81/13/1 was used.

Example 80 was prepared in the same way as Example 79 except 30 parts of Regalrez 1085 was used.

Example 81 was prepared in the same way as Example 79 except an IOA/IBA/AA ratio of 76/23/1 was used.

Example 82 was prepared in the same way as Example 81 except 40 parts of Regalrez 1085 was used.

Example 83 was prepared in the same way as Example 81 except an IOA/IBA/AA ratio of 81/17/2 was used.

Example 84 was prepared in the same way as Example 81 except an IOA/IBA/AA ratio of 76/22/2 was used.

Example 85 was prepared in the same way as Example 62 except an IOA/IBA/AA ratio of 90/9/1 was used.

Example 86 was prepared in the same way as Example 85 except 30 parts of Regalrez 6108 was used.

Example 87 was prepared in the same way as Example 85 except an IOA/IBA/AA ratio of 81/18/1 was used.

Example 88 was prepared in the same way as Example 87 except 40 parts of Regalrez 5108 was used.

Example 89 was prepared in the same way as Example 85 except an IOA/IBA/AA ratio of 76/23/1 was used.

Example 90 was prepared in the same way as Example 89 except 40 parts of Regalrez 5108 was used.

Example 91 was prepared in the same way as Example 85 except an IOA/IBA/AA ratio of 90/8/2 was used.

Example 92 was prepared in the same way as Example 91 except an IOA/IBA/AA ratio of 85/13/2 was used.

Example 93 was prepared in the same way as Example 92 except an IOA/IBA/AA ratio of 81/17/2 was used.

Example 94 was prepared in the same way as Example 93 except 30 parts of Regalrez 6108 was used.

Example 95 was prepared in the same way as Example 94 except 40 parts of Regalrez 6108 was used.

Example 96 was prepared in the same way as Example 92 except an IOA/IBA/AA ratio of 76/22/2 was used.

Example 97 was prepared in the same way as Example 96 except 30 parts of Regalrez 6108 was used.

Example 98 was prepared in the same way as Example 97 except 40 parts of Regalrez 6108 was used.

Example 99 was prepared in the same way as Example 68 except an IOA/IBA/AA ratio of 90/9/1 was used.

Example 100 was prepared in the same way as Example 99 except 30 parts of Regalrez 3102 was used.

Example 101 was prepared in the same way as Example 68 except an IOA/IBA/AA ratio of 81/18/1 was used.

Example 102 was prepared in the same way as Example 101 except 30 parts of Regalrez 3102 was used.

Example 103 was prepared in the same way as Example 68 except an IOA/IBA/AA ratio of 76/23/1 was used.

Example 104 was prepared in the same way as Example 103 except 30 parts of Regalrez 3102 was used.

Example 105 was prepared in the same way as Example 68 except an IOA/IBA/AA ratio of 90/8/2 was used.

Example 106 was prepared in the same way as Example 68 except an IOA/IBA/AA ratio of 81/17/2 was used.

Example 107 was prepared in the same way as Example 106 except 40 parts of Regalrez 3102 was used.

Example 108 was prepared in the same way as Example 68 except an IOA/IBA/AA ratio of 76/22/2 was used.

Example 109 was prepared in the same was as Example 74 except 10 parts of Regalrez 1094 was used and a monomer ratio of 90/9/1 IOA/IBA/AA was used.

Example 110 was prepared in the same way as Example 74 except a monomer ratio of 81/18/1 IOA/IBA/AA was used.

Example 111 was prepared in the same way as Example 109 except a monomer ratio of 76/23/1 IOA/IBA/AA was used.

Example 112 was prepared in the same way as Example 111 except 20 parts of Regalrez 1094 was used.

Example 113 was prepared in the same way as Example 109 except 10 parts of Regalrez 3102 was used, 0.09 parts of 2,4-bis(trichloromethyl)-6-(4-methoxyphenyl)-s-triazine crosslinker was used, N-octyl acrylamide (NOA) was used instead of IBA, and the monomer ratio was 89/10.5/0.5 IOA/NOA/AA.

Example 114 was prepared in the same way as Example 113 except that 30 parts Regalrez 3102 was used.

Example 115 was prepared in the same way as Example 62 except an IOA/IBA/AA ratio of 95/4.75/0.25 was used and 25 parts Regalrez 6108 was used.

Comparative Example C1

90 parts by weight of iso-octyl acrylate (IOA) and 10 parts acrylic acid (AA) were blended with 0.04 parts of 2,2-dimethoxy-2-phenylacetophenone photoinitiator (Irgacure™ 651, available from Ciba-Geigy Corp.) and photopolymerized with an ultraviolet light source under a constant nitrogen purge to a viscosity of about 3000 cps. 0.16 parts of additional 2,2-dimethoxy-2-phenylacetophenone photoinitiator and 0.15 parts of 2,4-bis(trichloromethyl)-6-(4-methoxyphenyl)-s-triazine were added to the acrylate syrup and mixed until all of the components had completely dissolved. After mixing the blend was knife-coated at a 5 mil thickness onto a silicone-treated polyethylene-coated paper release liner. The composite was then exposed to ultraviolet radiation having a spectral output from 300–400 with a maximum at 351 nm in a nitrogen-rich environment. An intensity of about 1.0 mW/cm² was used for the first one-third of the exposure time and an intensity of about 2.2 mW/cm² was used for the second two-thirds of the exposure time, resulting in a total energy of 250 mJ/cm².

Comparative example C2 was prepared in the same way as comparative example C1 except a premix of 94 parts IOA and 6 parts AA was used.

Comparative example C3 was prepared in the same way as comparative example C1 except a premix of 100 parts IOA and 0 parts AA was used.

The data of Example 57–115 and comparative examples C1, C2, and C3 are shown in Table III-3. Test procedures A1-III, B1-III, and C1-III were used to generate the data. The designation "nt" means not tested.

TABLE III-3

| Ex. | St.St. Peel (lb/0.5") | Poly-propylene peel (lb/0.5") | Room Temp Shear | 70° C. Shear | Percent Conversion |
|---|---|---|---|---|---|
| 57 | 3.83 | 3.63 | 313 | 35 | >98.5% |
| 58 | 3.73 | 3.87 | 1006 | 6 | >98.5% |
| 59 | 4.15 | 4.05 | 5867 | 10K+ | >98.5% |
| 60 | 2.66 | 2.84 | 7222 | 10K+ | >98.5% |
| 61 | 2.71 | 2.75 | 10K+ | 859 | >98.5% |
| 62 | 3.15 | 3.64 | 535 | 34 | >98.5% |
| 63 | 4.03 | 6.24 | 719 | 23 | >98.5% |
| 64 | 4.22 | 3.54 | 7223 | 10K+ | >98.5% |
| 65 | 5.33 | 6.84 | 2916 | 41 | >98.5% |
| 66 | 6.92 | 3.85 | 10K+ | 10K+ | >98.5% |
| 67 | 4.04 | 3.30 | 10K+ | 10K+ | >98.5% |
| 68 | 3.21 | 2.52 | 880 | 30 | >98.5% |
| 69 | 4.24 | 2.57 | 632 | 5 | >98.5% |
| 70 | 4.11 | 2.67 | 4900 | 10K+ | >98.5% |
| 71 | 4.94 | 3.04 | 1338 | 12 | >98.5% |
| 72 | 3.62 | 2.58 | 10K+ | 10K+ | >98.5% |
| 73 | 4.27 | 3.63 | 10K+ | 10K+ | >98.5% |
| 74 | 2.58 | 3.24 | 708 | nt | >98.5% |
| 75 | 3.22 | 3.26 | 1301 | nt | >98.5% |
| 76 | 3.50 | 3.54 | 10K+ | 10K+ | >98.5% |
| 77 | 3.90 | 3.38 | 10K+ | 10K+ | >98.5% |
| 78 | 2.69 | 3.55 | 2003 | 1870 | >98.5% |
| 79 | 3.24 | 3.57 | 10K+ | 3961 | >98.5% |
| 80 | 2.57 | 2.47 | 1865 | 27 | >98.5% |
| 81 | 4.32 | 3.34 | 4639 | 1714 | >98.5% |
| 82 | 3.00 | 3.91 | 242 | 5 | >98.5% |
| 83 | 3.05 | 3.00 | 5021 | 1902 | >98.5% |
| 84 | 3.39 | 3.56 | 3040 | 888 | >98.5% |
| 85 | 3.28 | 2.82 | 10K+ | 10K+ | >98.5% |
| 86 | 3.36 | 4.87 | 10K+ | 5307 | >98.5% |
| 87 | 4.96 | 3.01 | 10K+ | 10K+ | >98.5% |
| 88 | 5.60 | 5.65 | 2094 | 22 | >98.5% |
| 89 | 3.76 | 3.43 | 10K+ | 1376 | >98.5% |
| 90 | 4.76 | 3.10 | 5605 | 18 | >98.5% |
| 91 | 3.34 | 2.87 | 10K+ | 10K+ | >98.5% |
| 92 | 6.92 | 3.85 | 10K+ | 10K+ | >98.5% |
| 93 | 4.86 | 3.35 | 10K+ | 10K+ | >98.5% |
| 94 | 4.20 | 4.61 | 10K+ | 1287 | >98.5% |
| 95 | 5.73 | 3.18 | 10K+ | 60 | >98.5% |
| 96 | 4.55 | 1.75 | 10K+ | 10K+ | >98.5% |
| 97 | 5.88 | 5.44 | 10K+ | 207 | >98.5% |
| 98 | 4.58 | 4.38 | 7187 | 26 | >98.5% |
| 99 | 3.08 | 2.29 | 10K+ | 10K+ | >98.5% |
| 100 | 4.55 | 2.43 | 4516 | 1795 | >98.5% |
| 101 | 4.64 | 3.22 | 5396 | 10K+ | >98.5% |
| 102 | 4.68 | 1.63 | 2513 | 13 | >98.5% |
| 103 | 3.81 | 3.00 | 6798 | 10K+ | >98.5% |
| 104 | 4.89 | 1.64 | 10K+ | 155 | >98.5% |
| 105 | 3.72 | 2.41 | 10K+ | 10K+ | >98.5% |
| 106 | 3.61 | 1.96 | 10K+ | 10K+ | >98.5% |
| 107 | 6.63 | 4.62 | 4906 | 49 | >98.5% |
| 108 | 4.46 | 4.11 | 10K+ | 10K+ | >98.5% |
| 109 | 2.38 | 2.85 | 223 | 10K+ | >98.5% |
| 110 | 3.06 | 3.90 | 10K+ | 10K+ | >98.5% |
| 111 | 2.68 | 3.05 | 10K+ | 10K+ | >98.5% |
| 112 | 4.58 | 4.54 | 10K+ | 10K+ | >98.5% |
| 113 | 2.65 | 2.46 | 2297 | 150 | >98.5% |
| 114 | 3.66 | 4.06 | 616 | 12 | >98.5% |
| 115 | nt | nt | 2504 | 329 | >98.5% |
| C1 | 5.33 | 0.43 | 10,000+ | 10,000+ | >98.5% |
| C2 | 3.73 | 1.29 | 10,000+ | 10,000+ | >98.5% |
| C3 | 1.35 | 1.53 | 2 | 3 | >98.5% |

Examples 116–124

Example 116

83 parts IOA and 17 parts IBA were mixed together in a jar under a constant nitrogen purge along with 0.04 parts of Irgacure 651 photoinitiator from Ciba-Geigy Corp. (2,2-dimethoxy-2-phenylacetophenone). This mixture was exposed to a low intensity ultraviolet light under a constant nitrogen purge while stirring until a coatable viscosity syrup was obtained. The conversion of this syrup was between 4 and 10% and the viscosity was about 3,000 cps. 0.12 parts of 2,4-bis(trichloromethyl)-6-(3,4-dimethoxyphenyl)-s-triazine and an additional 0.16 parts Irgacure 651 were then added to the prepolymerized syrup, along with 20.5 parts of Regalrez 6108 tackifier (Hercules Co.). The ingredients were mixed thoroughly until homogeneous and then knife-coated at a 5 mil thickness onto a silicone-treated polyethylene-coated paper release liner. The composite was then exposed to ultraviolet radiation having a spectral output from 300–400 with a maximum at 351 nm in a nitrogen-rich environment. The average intensity was about 2.05 mW/cm². resulting in a total energy of 650 mJ/cm².

Example 117 was prepared in the same way as example 116 except that the monomer mixture was 77 parts IOA and 23 parts IBA. Also, 13.6 parts Regalrez 6108 was used.

Example 118 was prepared in the same way as example 116 except that the monomer mixture was 71 parts IOA and 21 parts IBA. Also, 7.5 parts Regalrez 6108 was used.

Example 119 was prepared in the same way as example 116 except that the monomer mixture was 84 parts IOA, 15 parts IBA, and 1 part AA. Also, 20.5 parts Regalrez 6108 was used.

Example 120 was prepared in the same way as example 116 except that the monomer mixture was 81 parts IOA, 18 parts IBA, and 1 part AA. Also, 17.6 parts Regalrez 6108 was used.

Example 121 was prepared in the same way as example 116 except that the monomer mixture was 72 parts IOA, 27 parts IBA, and 1 part AA. Also, 7.5 parts Regalrez 6108 was used.

Example 122 was prepared in the same way as example 116 except that the monomer mixture was 83 parts IOA and 17 parts IBA. Also, 5 parts Regalrez 6108 was used.

Example 123 was prepared in the same way as example 122 except that 15 parts Regalrez 6108 was used.

Example 124 was prepared in the same way as example 122 except that 30 parts Regalrez 6108 was used.

Comparative Example C4

94 parts IOA and 6 parts AA were mixed together in a jar under a constant nitrogen purge along with 0.04 parts of Irgacure 651 photoinitiator from Ciba-Geigy Corp. (2,2-dimethoxy-2-phenylacetophenone). This mixture was partially polymerized under a nitrogen-rich atmosphere to provide a coatable syrup having a viscosity of about 3,000 cps.

0.16 parts of 2,4-bis(trichloromethyl)-6-(3,4-dimethoxyphenyl)-s-triazine and an additional 0.16 parts Irgacure 651 were then added to the prepolymerized syrup and it was then knife-coated onto a release coated paper backing at a thickness of 5 mils. The resulting coating was then exposed to ultraviolet radiation having a spectral output from 300–400 with a maximum at 351 nm in a nitrogen-rich environment. The average intensity was about 2.05 mW/cm$^2$, resulting in a total energy of 650 mJ/cm$^2$.

Comparative example C5 was prepared in the same way as comparative example C4 except that a premix of 10 parts AA and 90 parts IOA was used. In addition, 0.12 parts triazine was used. Comparative example C6 was prepared in the same way as comparative example C4 except that a premix of 14 parts AA and 86 parts IOA was used.

Peel and shear data for examples 116–124 and comparative examples C4, C5, and C6 are set forth in Table III-4. The data was generated according to Test Procedures A2-III, B2-III, and C2-III.

TABLE III-4

PATENT EXAMPLES FOR TACKIFIED NPAs FOR OILY METAL SURFACES

| Example | Stainless Steel Peel 24 Hour | Room Temp Shear | 70 C Shear | 10 Second Peel Cold Rolled Steel | 1 Min. Peel Cold Rolled Steel | Percent Conversion |
|---|---|---|---|---|---|---|
| 116 | 32.6 | 1020 | 85 | 4.0 | 5.1 | >98 |
| 117 | 41.9 | 581 | 300 | 4.7 | 6.7 | >98 |
| 118 | 40.9 | 481 | 331 | 4.0 | 4.7 | >98 |
| 119 | 61.1 | 1927 | 426 | 4.6 | 10.3 | >98 |
| 120 | 50.7 | 5391 | 338 | 5.4 | 9.2 | >98 |
| 121 | 47.0 | 10K+ | 10K+ | 4.4 | 8.8 | >98 |
| 122 | 36.6 | 127 | 599 | 7.3 | 10.5 | >98 |
| 123 | 43.5 | 1314 | 10K+ | 9.3 | 12.4 | >98 |
| 124 | 56.8 | 810 | 17 | 7.9 | 12.5 | >98 |
| C4 | 51.2 | O(DNS) | O(DNS) | 10K+ | nt | >97 |
| C5 | 37.6 | O(DNS) | O(DNS) | 10K+ | nt | >97 |
| C6 | 61.5 | O(DNS) | 0.7 | 10K+ | nt | >97 |

Vibration Damping Adhesives
Example 1

A composition was prepared by mixing 67 parts isooctyl acrylate, 32 parts isobornyl acrylate, 1 part acrylic acid, and 0.04 part benzil dimethyl ketal photoinitiator (KB-1 from Sartomer). The mixture was partially polymerized in a nitrogen rich atmosphere using fluorescent black lights to a syrup having a viscosity of about 3000 centipoise. An additional 0.16 part KB-1 photoinitiator and 0.15 part hexane dioldiacrylate were added to the syrup, which was then mixed and knife coated to a thickness of about 50 microns onto a silicone-treated, polyethylene coated paper release liner. The coated mixture was exposed to ultraviolet radiation having a major portion of the spectral output between 300 and 400 nanometers, with a maximum at 351 nanometers, and at an intensity of about 2 milliWatts/cm$^2$. The total energy was about 650 milliJoules/cm$^2$. The resulting sheet material was then laminated to a 0.165 mm thick panel of cold rolled steel to form a constrained layer damper.

The constrained layer damper was cut to a dimension of 20.3 centimeters by 20.3 centimeters and laminated to an automotive door panel. The door panel with the damper was suspended with Tygon tubing, and an accelerometer (Model 22 from Endevco Co., San Juan Capistrano, Calif.) was attached to the door panel and wired to a Fast Fourier Transform (FFT) analyzer (Model 2630 Analyzer from Tektronix). The analyzer was also attached to an impact hammer (obtained from PCB, DePew, N.Y.). In testing, the impact hammer was used to strike the panel, which caused various modes of excitation or vibration to occur within the panel. The acceleration was then measured as a function of time, and the FFT analyzer was used to convert the results to acceleration as a function of frequency. The frequencies (FREQ) of the first eight modes were determined using STAR Modal software from Structural Measurement Systems, Milipitas, Calif. The average loss factors (AVG) for all eight modes were also calculated.

In comparison, the test was also conducted on the same door panel without a damper, and also with a commercially accepted damper (measuring 20.3 cm by 20.3 cm) having 1.78 millimeters of a black mastic material on a 0.10 mm thick aluminum constraining layer. All of the test results are shown in Table IV-1.

TABLE IV-1

| | Example 1 | | No Damper | | Commercial Damper | |
|---|---|---|---|---|---|---|
| Mode | FREQ-HZ | LOSS | FREQ-HZ | LOSS | FREQ-HZ | LOSS |
| 1 | 61.8 | 0.01036 | 61.5 | 0.00326 | 60.4 | .00222 |
| 2 | 76.0 | 0.00800 | 75.9 | 0.00718 | 76.1 | 0.00768 |
| 3 | 99.1 | 0.00750 | 99.5 | 0.00538 | 98.4 | 0.00544 |
| 4 | 117.0 | 0.00630 | 116.9 | 0.0037 | 119.4 | 0.00212 |
| 5 | 135.1 | 0.01512 | 130.9 | 0.00674 | 130.7 | 0.00942 |
| 6 | 140.0 | 0.02182 | 136.0 | 0.00502 | 136.3 | 0.01988 |
| 7 | 146.4 | 0.00608 | 142.5 | 0.00350 | 143.5 | 0.00212 |
| 8 | 151.0 | 0.01614 | 148.6 | 0.00696 | 147.9 | 0.01386 |
| AVG | — | 0.01142 | — | 0.00522 | — | 0.00790 |

The data in Table 1 show that vibration damping composites, i.e., constrained layer dampers, of the invention provide superior damping as compared to commercial products as shown by the greater loss factor.

Adhesives Comprising Electrically Conductive Agents
TEST METHODS
Shorted Configuration Resistance Test (SCRT)

This test is a measure of the interconnect resistance in the adhesive bond. In this particular test, it is desirable that the resistance readings are less than about 20 Ohms per connection, and preferably less than 10 Ohms.

A 0.025 mm thick copper coating on a polyester flexible circuit (3M™ Brand Heat Seal Connector without adhesive available from Minnesota Mining & Manufacturing Co., St.

Paul Minn.) is used in a four wire resistance set-up shown in FIG. 1. A bond is prepared by laminating a 0.3 cm wide by 2.5 cm long strip of the electrically conductive adhesive film 6 across one end of the polyester flexible circuit 2 to a printed circuit board 8 (FR-4 test circuit board). Alternatively, the adhesive can be screen printed or knife coated directly onto the flexible circuit. The lamination is performed either by hand pressure for a pressure-sensitive adhesive, or by a hot bar bonder with a 3 mm by 25.4 mm thermode (TCW 125, from Hughes Aircraft) for a heat activated adhesive. The flex is shorted to allow for resistance measurements by providing a solid copper pattern 4 on the flex as shown in FIG. 1. The bonded sample is tested for interconnect resistance by using the four-wire method using the principles described in ASTM B 539-90 such that the net resistance not due to the interconnection is minimized to approximately 150 milliOhms. The samples are tested after bonding (INIT) and after aging at 60 C and 95% relative humidity for 10 days (AGED) and results are reported in Ohms.

Jumper Configuration Resistance Test (JCRT)

This test is a measure of the electrical resistance through two adhesive bonds and a conducting circuit. In this particular configuration, it is desirable for resistance readings to average less than about 100 Ohms, and preferably less than about 20 Ohms.

Figure 2:
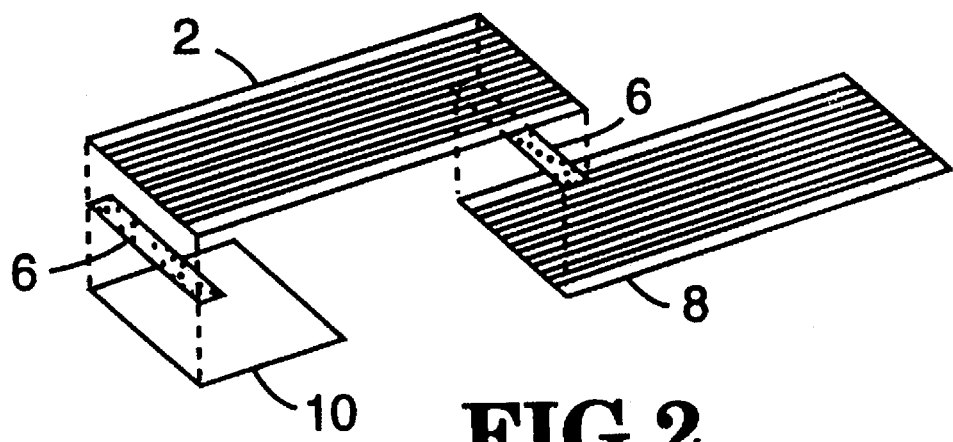
FIG. 2 is an apparatus for measuring the electrical resistance through two adhesive bonds and a conducting circuit.

A test sample in FIG. 2 is prepared by bonding a straight line 8 mil (0.2 mm) pitch flexible circuit 2 (3M™ Brand Heat Seal Connector without adhesive, available from Minnesota Mining & Manufacturing Co., St. Paul Minn.) between a printed circuit board 8 (FR-4 circuit board) and an ITO (indium tin oxide) coated glass plate 10 (20 Ohms/square sheet resistivity, available from Nippon Sheet Glass, Japan). The adhesive can be pre-applied to the flexible circuit by screen printing or knife coating the adhesive onto the circuit or it can be applied as a film adhesive or adhesive transfer between the flexible circuit and the circuit board and glass at the time of bonding. The circuit traces of the flexible electrical circuit are aligned to the corresponding traces on the circuit board and bonded by hand pressure for a pressure-sensitive adhesive, or by hot bar bonded for a heat activated adhesive. Hot bar bonding is accomplished with a 3 mm by 25.4 mm thermode (TCW 125, from Hughes Aircraft) set at 145 C and the indicated pressure for 10 seconds. Electrical resistance of the adhesive interconnection is measured using a four wire method according to the principles described in ASTM B 539-90 such that the net resistance not due to the interconnection is minimized to approximately 150 milliOhms. Samples are tested after bonding (INIT) and after aging at 60 C and 95% relative humidity for 10 days. (AGED).

90° Peel Adhesion

This test is conducted by adhering a flexible electrical circuit with the adhesive to either an FR-4 circuit board or to an indium tin oxide (ITO) glass plate having 20 Ohms/square sheet resistivity (available from Nippon Sheet Glass, Japan) by hand for a pressure-sensitive adhesive, or using a 3 mm by 25.4 mm pulsed heat thermode (TCW 125, from Hughes Aircraft) set at 145 C and 800 psi (5516 KiloPascals) for 10 seconds. The circuit board is mounted in a fixture in the lower jaw of an Instron™ Tensile Tester so that the flexible circuit, mounted in the upper jaw, would be pulled off at a 90° angle. The width of the flexible circuit is 1.9 to 2.5 cm. The jaw separation speed was 2.54 millimeters per minute and results are recorded in grams/centimeter. Samples are tested after bonding (INIT) and after aging at 60 C and 95% relative humidity for 10 days (AGED) and results are reported in grams/centimeter (g/cm).

Example 1

A conductive pressure-sensitive adhesive composition was prepared by mixing 67 parts IOA (isooctyl acrylate), 33 parts IBA (isobornyl acrylate), and 0.04 pph (part per 100 parts of acrylate and co-monomer) benzil dimethyl ketal (Escacure™ KB-1 from Sartomer) in a glass jar, purging the jar with nitrogen, and exposing to ultraviolet radiation from fluorescent black lights which have at least 90% of their spectral output between 300 and 400 nanometers with a peak emission at about 350 nanometers until a viscous syrup having a viscosity estimated to be about 2000 to 3000 centipoise was formed. An additional 0.16 pph benzil dimethyl ketal and 0.1 pph HDDA (1,6-hexanediol diacrylate), and 20 pph silver coated nickel (20 to 40 micrometers available from Potter Industries) were added to the syrup and mixed thoroughly. The syrup mixture was then knife coated to a thickness of 0.025 mm on a silicone release coated polyethylene coated kraft paper. The coated mixture was then exposed, in a nitrogen rich atmosphere (less than about 200 ppm oxygen), to ultraviolet radiation from lamps as described above, for 5 minutes for form an electrically conductive pressure-sensitive adhesive film. The average intensity of the lights was 3.9 milliWatts/square centimeter ($mW/cm^2$) as measured with a radiometer (EIT) according to the National Institute of Standard Testing (NIST) units. The pressure-sensitive adhesive film was used to made a flexible circuit which was tested for conductivity (through a resistance measurement) according to the Shorted Configuration Resistance Test, and test results are shown in Table V-1.

Example 2

An electrically conductive pressure-sensitive adhesive film was prepared as in Example 1 except that the syrup composition had 65 parts IOA and 35 parts IBA, and pph of silver coated nickel particles. The particles constituted 30% by weight of the syrup composition. The resulting adhesive film was used to make a flex circuit which tested for conductivity according to both the Shorted Configuration Resistance Test and the Jumper Configuration Resistance Test and results are shown in Table V-1.

Example 3

An electrically conductive pressure-sensitive adhesive film was prepared as in Example 2, except that 20 pph of a hydrocarbon tackifying resin (Regalrez™ 6108 available from Hercules) were added to the syrup before coating, the amount of HDDA was 0.075 pph instead of 0.1 pph, 20 pph of sub-11 micrometer gold coated nickel particles (available from Potter Industries) were added instead of the silver coated nickel particles. The resulting adhesive film was used to make a flex circuit using a heated bar set at 140 C and 34.5 kiloPascals (5 psi) for 5 seconds to effect the bonding of the adhesive film to the flex and the board, and tested according to the Jumper Configuration Resistance Test and results are shown in Table V-1.

Example 4

A heat bondable electrically conductive film was prepared as in Example 3 except that the syrup composition was 40 parts IOA and 60 parts IBA, with no tackifying resin. The nickel particles constituted 20% by weight of the syrup composition. The adhesive film was heat bonded to a polyester flex and board and the flex circuit tested as in Example 3 and test results are shown in Table V-1.

TABLE V-1*

| Ex | SCRT - Ohms/ | | JCRT - Ohms | |
|---|---|---|---|---|
| | INIT | AGED–HOURS | INIT | AGED–HOURS |
| 1 | 3 | 5–285 | ** | ** |
| 2 | 4 | 5–358 | 10 | 12–210 |
| 3 | ** | ** | 3 | 8–307 |
| 4 | ** | ** | 2 | 10–307 |

*Numbers indicate an average of 15 lead resistance readings.
**Not Tested

The data in Table V-1 indicate that the adhesives of the invention provide stable electrical connections.

Example 5

A heat activatable conductive adhesive syrup was prepared according to the procedure of Example 1 by partially polymerizing 40 parts IOA, 60 parts IBA, 0.1 pph benzil dimethyl ketal photoinitator, and 0.04 pph carbon tetrabromide. An adhesive composition was prepared by mixing the syrup with 0.05 pph HDDA and 0.3 pph TPO photoinitiator (Lucirin TPO, available from BASF) until both were dissolved. Then 4 pph fumed silica (Cab-O-Sil M5) and 20 pph conductive nickel spheres (CNS, air classified −20/+10 μm available from Novamet, Inc.) were dispersed into the composition with a high shear mixer. The 20 pph of nickel spheres is 5% by volume of the adhesive composition. The adhesive composition was then screen printed onto a flexible electrical circuit (3M™ Brand Heat Seal Connector without adhesive, available from Minnesota Mining & Manufacturing Co., St. Paul, Minn.) using a flat bed screen printer (Model 2BS Roll to Roll Screen Press System from Rolt Engineering Ltd.) with a 200 mesh polyester screen with 31° bias and 25 mil (0.635 mm) emulsion thickness and a 60 durometer rounded edge squeegee. The adhesive composition was printed in the print/flood mode with a squeegee pressure of 20 psi (138 kiloPascals), 20 inches per second squeegee speed (50.8 cm/sec) and 20 inches per second (50.8 cm/sec) flood blade speed, and a minimum squeegee angle. The adhesive coating thickness was 43 to 53 μm.

The screen primed adhesive was cured by exposing the adhesive to fluorescent black lights as described in Example 1 at an intensity of about 4.5 to 5.5 milliWatts/square centimeter, and a total energy of about 335 to 350 milliJoules/square centimeter. The resulting adhesive was essentially non-tacky at room temperature but became tacky when heated to about 35 C. The printed flexible circuit was tested for electrical resistance and peel adhesion to both and ITO glass substrate and to a FR-4 circuit board. Test results are shown in Table V-2.

Example 6

A heat activatable conductive adhesive was prepared as in Example 5 except that the amount of HDDA was reduced to 0.035 pph and the conductive nickel spheres were 2% cold coated conductive nickel spheres. The adhesive was then screen printed to a thickness of about 30 to 40 μm on the ends of the circuit traces of a flexible circuit. The adhesive was then cured as described above. This cure was followed by an exposure to mercury arc lamps for an exposure of 1100 milliJoules/square centimeter. The portion of the flexible circuit that was not adhesive coated had been coated with a non-adhesive protective cover coat (Enplate, from Enthone-Omi, Inc.). The resulting flexible circuit was tested for electrical resistance and peel adhesive as described above except that the bonding pressure was reduced from 800 psi (5516 kiloPascals) to 540 psi (3723 kiloPascals), and the AGED results reported are after 13 days of aging. Test results are shown in Table V-2.

TABLE V-2

| | Example 5 | | Example 6 | |
|---|---|---|---|---|
| | INIT | AGED | INIT | AGED |
| RESISTANCE | | | | |
| AVG - Ohms | 2.3 | 9.8 | 2.2 | 12.1 |
| MIN - Ohms | 2.1 | 4.4 | 2.0 | 5.9 |
| MAX - Ohms | 2.6 | 18.0 | 4.9 | 20.6 |
| Peel Adhesion | | | | |
| Glass - g/cm | 826 | 1176 | 617 | 1883 |
| Board - g/cm | 1184 | 2836 | 834 | 1250 |

The results in Table V-2 show that the adhesives of the invention are suitable for coating on to flexible circuits to provide electrical connections.

Other embodiments are within the following claims.

What is claimed is:

1. A tape comprising:
   (a) a layer of a composition consisting essentially of a pressure sensitive adhesive polymer and an electrically conductive agent,
   said pressure sensitive adhesive polymer consisting of the reaction product of:
   (i) 25–97 parts by weight of an acrylic acid ester of a monohydric alcohol whose homopolymer has a Tg less than 0° C.;
   (ii) 3–75 parts by weight of a non-polar ethylenically unsaturated monomer whose homopolymer has a solubility parameter of no greater than 10.50 and a Tg greater than 15° C.; and
   (iii) 0–5 parts by weight of a polar ethylenically unsaturated monomer whose homopolymer has a solubility parameter of greater than 10.50 and a Tg greater than 15° C.,
   the relative amounts of said acrylic acid ester, said non-polar ethylenically unsaturated monomer, and said polar ethylenically unsaturated monomer being chosen such that the 90° peel adhesion of said reaction product to a polypropylene surface is at least 2 lbs/0.5 in. after a 72 hour dwell at room temperature as measured according to Test Procedure B-I; and
   (b) a tape substrate.

2. A tape comprising:
   (a) a layer of a composition consisting essentially of a heat-activatable adhesive polymer and an electrically conductive agent,
   said heat-activatable adhesive polymer consisting of the reaction product of:
   (i) 25–97 parts by weight of an acrylic acid ester of a monohydric alcohol whose homopolymer has a Tg less than 0° C.;
   (ii) 3–75 parts by weight of a non-polar ethylenically unsaturated monomer whose homopolymer has a solubility parameter of no greater than 10.50 and a Tg greater than 15° C.; and (iii) 0–5 parts by weight of a polar ethylenically unsaturated monomer whose homopolymer has a solubility parameter of greater than 10.50 and a Tg greater than 15° C., the relative amounts of said acrylic acid ester, said non-polar ethylenically unsaturated monomer, and said polar ethylenically unsaturated monomer being chosen such that said heat-activatable adhesive polymer is essentially non-tacky at 20° C. and has a Tg of 30° C. or greater; and (b) a tape substrate.

3. The tape of claim 2, wherein said tape substrate is a plastic film and wherein a plurality of electrically conductive areas overlay the plastic film and underlay and contact said heat activatable adhesive.

4. The tape of claim 2, wherein no electrically conductive particle has a diameter greater than the thickness of the layer of heat activatable adhesive.

* * * * *